(12) United States Patent
Suzuki et al.

(10) Patent No.: US 6,639,260 B2
(45) Date of Patent: Oct. 28, 2003

(54) SEMICONDUCTOR DEVICE HAVING A VERTICAL SEMICONDUCTOR ELEMENT

(75) Inventors: Takashi Suzuki, Aichi-gun (JP);
Tsutomu Uesugi, Aichi-gun (JP);
Norihito Tokura, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/015,917

(22) Filed: Dec. 17, 2001

(65) Prior Publication Data

US 2002/0074596 A1 Jun. 20, 2002

(30) Foreign Application Priority Data

Dec. 18, 2000 (JP) .......................... 2000-383440

(51) Int. Cl.$^7$ ..................... H01L 29/76; H01L 29/94; H01L 31/062; H01L 31/113; H01L 31/119
(52) U.S. Cl. ........................... 257/288; 257/330
(58) Field of Search .................... 257/110, 197, 257/288, 327–334, 347, 655

(56) References Cited

U.S. PATENT DOCUMENTS

| | | | | |
|---|---|---|---|---|
| 4,754,310 A | * | 6/1988 | Coe | 357/13 |
| 5,216,275 A | * | 6/1993 | Chen | 257/493 |
| 5,378,914 A | * | 1/1995 | Ohzu et al. | 257/369 |
| 5,438,215 A | * | 8/1995 | Tihanyi | 257/401 |
| 5,519,236 A | * | 5/1996 | Ozaki | 257/302 |
| 5,895,939 A | * | 4/1999 | Ueno | 257/279 |
| 5,981,996 A | * | 11/1999 | Fujishima | 257/335 |
| 6,040,600 A | * | 3/2000 | Uenishi et al. | 257/330 |
| 6,081,009 A | | 6/2000 | Neilson | |
| 2001/0028083 A1 | * | 10/2001 | Onishi et al. | 257/328 |
| 2001/0052601 A1 | * | 12/2001 | Onishi et al. | 257/138 |
| 2002/0040994 A1 | * | 4/2002 | Nitta et al. | 257/328 |
| 2002/0088990 A1 | * | 7/2002 | Iwamoto et al. | 257/136 |

FOREIGN PATENT DOCUMENTS

| | | | | |
|---|---|---|---|---|
| JP | A-3-155167 | | 7/1991 | |
| JP | A-8-316480 | | 11/1996 | |
| JP | A-9-266311 | | 10/1997 | |
| JP | A-2000-260984 | | 9/2000 | |
| JP | A-2000-277726 | | 10/2000 | |
| JP | 2001-144292 | * | 5/2001 | ........... H01L/29/78 |

\* cited by examiner

Primary Examiner—Stephen D. Meier
Assistant Examiner—Monica Lewis
(74) Attorney, Agent, or Firm—Posz & Bethards, PLC

(57) ABSTRACT

A vertical type MOS field effect transistor has a super junction structure between a source electrode and an N$^+$-type drain region. The super junction structure is constituted by a plurality of P-type single crystal silicon regions and a plurality of N-type single crystal silicon regions. Each of the plurality of P-type single crystal silicon regions and each of the plurality of N-type single crystal silicon regions are arrayed alternately. The super junction has two parts, that is, a cell forming region where a MOS structure is disposed and a peripheral region located at a periphery of the cell forming region. The source electrode contacts one of the P-type single crystal silicon regions in the peripheral region while disposed away from an end portion of the peripheral region that is located at an outermost in the peripheral region.

24 Claims, 18 Drawing Sheets

SEMICONDUCTOR DEVICE HAVING A VERTICAL SEMICONDUCTOR ELEMENT

CROSS REFERENCE TO RELATED APPLICATION

This application is based upon Japanese Patent Application No. 2000-383440 filed on Dec. 18, 2000, the contents of which are incorporated herein by reference.

BACKGROUND OF THE INVENTION

1. Field of the Invention

The present invention relates to a semiconductor device which has a super junction structure.

2. Related Art

A vertical type MOS field effect transistor representing a vertical type semiconductor device is employed to, for example, a power conversion or a power control of a motor for a vehicle or household electric appliance. The one having a super junction structure is disclosed in JP-A-11-233759 and JP-A-9-266311. The super junction structure is constituted by a structure in which a first semiconductor region of first conductive type and a second semiconductor region of second conductive type are arrayed alternately on a semiconductor substrate. This structure has a performance that exceeds a limit performance of silicon can be achieved, and is useful for achieving low resistivity in the vertical type semiconductor device.

In the super junction structure, the alternately arrayed structure of the first conductive type semiconductor region and the second conductive type semiconductor region is terminated at a semiconductor region disposed at an end of the semiconductor substrate. Therefore, a structure of an end of the alternately arrayed structure is very important. When no design is provided to that structure, in a situation where an applied voltage is larger than a withstand voltage at a connection between the first conductive type semiconductor region and the second conductive type semiconductor region, a dielectric breakdown may occur at the semiconductor region disposed at the end of the super junction structure. As a result, the performance exceeding the limit performance of silicon cannot be achieved.

SUMMARY OF THE INVENTION

An object of the invention is to provide a semiconductor device capable of withstanding high voltage.

In a semiconductor device having a vertical type element and a super junction structure on a semiconductor substrate of first conductive type, a first semiconductor region of first conductive type and a second semiconductor region of second conductive type are arrayed alternately in the super junction structure to form an element forming region and a peripheral region disposed at a periphery of the element forming region in the super junction structure. The peripheral region has an end portion constituted by the second semiconductor region. Incidentally, an electrode portion is disposed on the super junction structure. In this structure, the semiconductor substrate is electrically conducted to the first semiconductor region, the electrode is located away from the end portion while electrically conducted to the second semiconductor region disposed in the peripheral region.

According to an aspect of the present invention, a depletion layer can be expanded toward the end portion in an inside of the super junction structure. Besides, at a side of the electrode portion in the super junction structure, the depletion layer can be expanded toward the end portion. With this structure, electric concentration can be loosened at the side of the electrode portion in the super junction structure, so that withstand voltage of the semiconductor device can be improved. As a result, according to the present invention, the withstand voltage exceeds the limit in silicon.

Preferably, a third semiconductor region of second conductive type is arranged between the electrode portion and the peripheral region to electrically connect the second semiconductor region in the peripheral region and the electrode portion.

According to a second aspect of present invention, an inside of the semiconductor substrate is completely depleted by the super junction structure. Moreover, the electric field is decreased by expanding the depletion layer at the vicinity of a surface of the substrate. Therefore, the withstand voltage can be further improved.

Preferably, a fourth semiconductor region of first conductive type is disposed in the peripheral region to electrically connect each first semiconductor region located in the peripheral region. More specifically, the fourth semiconductor region of first conductive type is disposed in the second semiconductor region disposed in the peripheral region.

According to a third aspect of the present invention, in an off state of the semiconductor device, when voltage is applied to the electrode portion and the semiconductor substrate, the depletion layer is divided into a vertical electric field and a lateral electric field. A leak current is reduced by, especially, the lateral electric field in a low voltage.

Other features and advantages of the present invention will become more apparent from the following detailed description made with reference to the accompanying drawings.

DETAILED DESCRIPTION OF THE PREFERRED EMBODIMENT

Figure 1:
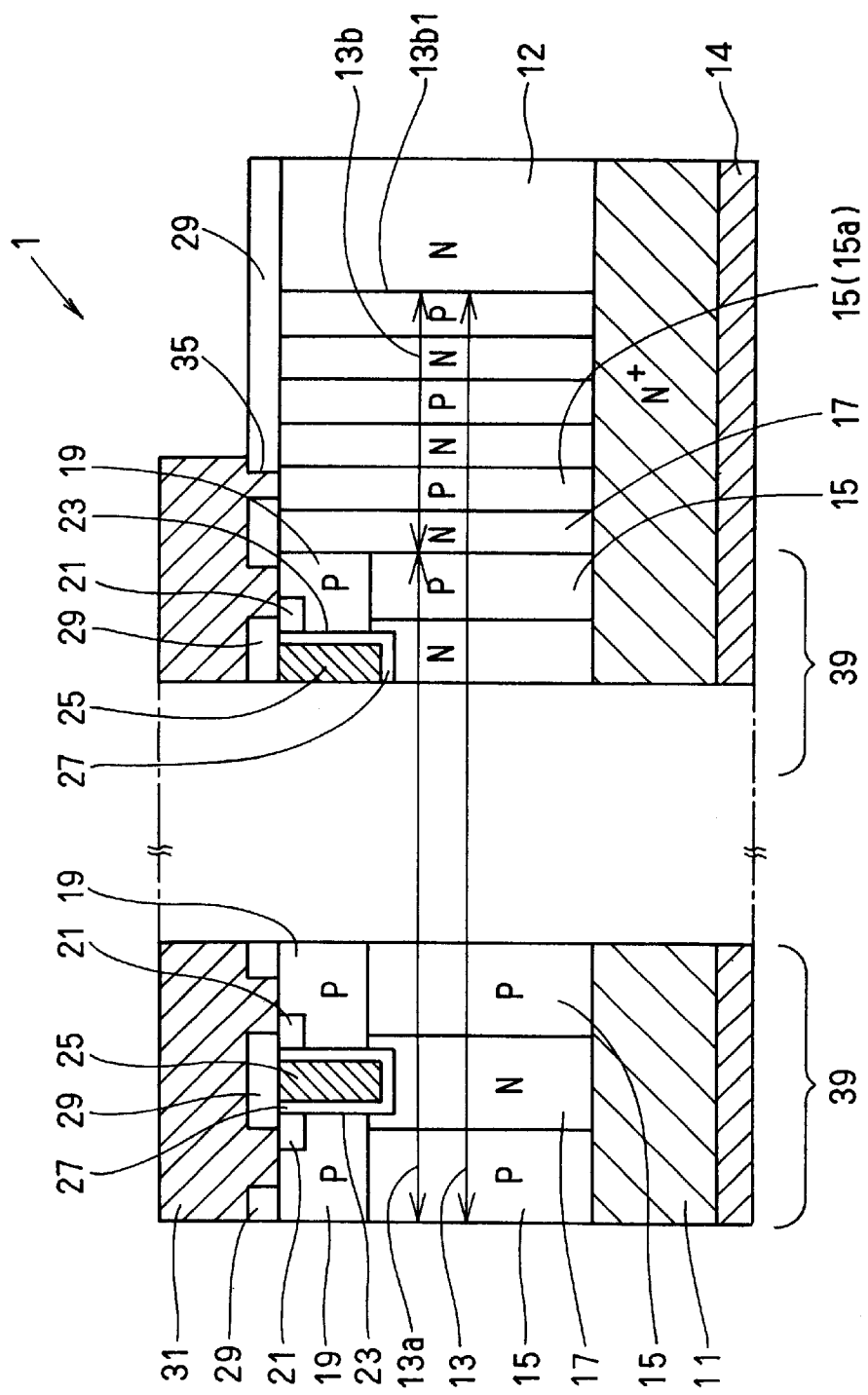
FIG. 1 is a schematic cross sectional view of a semiconductor device in a first embodiment of the present invention.

Specific embodiments of the present invention will now be described hereinafter with reference to the accompanying drawings in which the same or similar component parts are designated by the same or similar reference numerals.

[First Embodiment]

The present invention is employed to a vertical type MOS field effect transistor (hereinafter, referred to as a VMOS) 1 in this first embodiment. A schematic structure of the VMOS 1 will be explained below. A plurality of cells 39, i.e., a plurality of vertical type semiconductor elements constitutes the VMOS 1. Each cell 39 designates one unit in activation of the VMOS 1. Each of the plurality of cells 39 is arrayed in a transversal direction and a vertical (depth) direction with respect to the sheet of FIG. 1. A super junction structure 13 has a cell forming region 13a for the plurality of cells 39 and a peripheral region 13b that is located at a periphery of the cell forming region 13a. An electrode portion 31 is formed on a substrate as a source electrode so as to directly contact p-type regions and n-type regions as a source, and at least one of p-type regions in the peripheral region 13b. As a feature of the first embodiment, the electrode portion 31 is electrically conducted to a P-type single crystal silicon region 15(15a) by connecting the electrode portion 31 and the P-type single crystal silicon region 15(15a).

Next, details of the structure in the VMOS 1 will be explained. The VMOS 1 has an $N^+$-type drain region 11, the super junction structure 13, and $N^+$-type source regions 21. The $N^+$-type drain region 11 is formed in a silicon substrate. An electrode 14 is formed on the silicon substrate at a back surface thereof, which is composed of, for example, aluminum.

The super junction structure 13 is located on the $N^+$-type drain region 11. A P-type single crystal silicon region 15 and an N-type single crystal silicon region 17 are arrayed alternately on the $N^+$-type drain region 11 (silicon substrate). That is, a plurality of P-type single crystal silicon regions 15 and a plurality of N-type single crystal silicon regions 17 are disposed on the $N^+$-type drain region 11. The N-type single crystal silicon region 17 works as a drift region where a current flows. An end portion 13b1 is comprised in the peripheral region 13.

An N-type single crystal silicon region 12 is located at an outside of the super junction structure 13. The N-type single crystal silicon region 12 constitutes a side portion of the VMOS 1. The N-type single crystal silicon region 12 has the same concentration of N-type impurity as the N-type single crystal silicon region 17.

A p-type single crystal silicon region 19 is located on the cell forming region 13a. A trench 23 is formed in the P-type single crystal silicon region 19, which reaches the N-type single crystal silicon region 17. The trench is filled with a trench gate electrode 25 composed of, for example, polycrystalline silicon film. A gate oxide film 27 is formed between a bottom of the trench 23 and the trench gate electrode 23, and a sidewall of the trench 23 and the trench gate electrode 23. A channel is generated at a portion of the P-type single crystal silicon region 19 that is located at a side along the sidewall of the trench 23. $N^+$-type source regions 21 are formed in the P-type single crystal silicon region 19 so as to be located at an upper portion of the P-type single crystal silicon region 19 and located around the trench 23. An insulation film 29, which is composed of, for example, silicon oxide film, is formed on the P-type single crystal silicon region 19 and the peripheral region 13b. Contact holes are formed in the insulation film 29 so as to expose a part of the N+-type source region and a part of the P-type single crystal silicon region 19. Moreover, a contact hole 35 is formed in the insulation film 29 so as to expose a part of the P-type single crystal silicon region 15(15a). The P-type single crystal silicon region 15(15a) is located at a position disposed away from the end portion 13b1 of the super junction structure 13.

The electrode portion 31, which is composed of, for example, aluminum, is formed on the insulation film 29 so as to fill the contact holes 37 and the contact hole 35 to be connected to the N$^+$-type source regions 21, the P-type single crystal silicon regions 19 and the P-type single crystal silicon region 15(15a).

Next, main feature in the first embodiment will be explained. The electrode portion 31 is disposed away from the end portion 13b1 of the super junction structure 13, and is electrically connected to the P-type single crystal silicon region 15(15a) that constitutes the peripheral region 13b. Therefore, a depletion layer can be expanded toward the end portion 13b1 at an inside of the super junction structure. Moreover, at a side of the electrode portion 31 in the super junction structure 13, the depletion layer can be expanded toward the end portion 13b1. Thus, electric concentration can be loosened at a side of a portion where the end portion 13b1 is disposed (namely, the vicinity of a front surface of the super junction 13) in the super junction structure 13, so that withstand voltage of the VMOS 1 can be improved.

Incidentally, P-type single crystal silicon regions 15 other than the P-type single crystal silicon region 15(15a) are not connected to the electrode portion 31 so as to be in a floating state.

Hereinafter, modifications of the first embodiment will be described.

I. Although the N$^+$-type source regions 21, the P-type single crystal silicon regions 19 and the P-type single crystal silicon region 15(15a) are connected to the electrode portion 13 in common, an electrode portion for the P-type single crystal silicon region 15(15a) and an electrode portion for the N$^+$-type source regions 21, the P-type single crystal silicon regions 19 may be separated.

II. In the P-type single crystal silicon regions 15 constituting the peripheral region 13b, the P-type single crystal silicon region 15(15a) contacting the electrode portion 31 is disposed at a furthest location with respect to the end portion 13b1. However, the P-type single crystal silicon region 15(15a) can be located anywhere insofar as being disposed away from the end portion 13b1.

III. Although the trench gate electrode 25 is employed as a gate electrode, a planar gate electrode can be employed.

IV. The present invention can be employed to the other type of a vertical type semiconductor device.

V. Although the VMOS 1 is an N-type in this embodiment, a P-type can be adopted.

Incidentally, these modifications can be adopted in a second and a third embodiment described below.

[Second Embodiment]

The present invention is employed to a vertical type MOS field effect transistor (hereinafter, referred to as a VMOS) 3 in this second embodiment. Portions in the VMOS 3 that are different from the VMOS 1 will be explained while explanation of the same or similar portions to the first embodiment will be omitted.

A P-type single crystal silicon region 41 is formed on the peripheral region 13b so as to be connected to the P-type single crystal silicon regions 15. Impurity concentration of the P-type single crystal silicon region 41 may be the same as the P-type single crystal silicon regions 15, or may be different from the P-type single crystal silicon regions 15. The electrode portion 31 is connected to the P-type single crystal silicon region 41 through the contact hole 35. According to the second embodiment, as explained in a simulation described below, the withstand voltage can be enhanced as compared to the first embodiment.

[Third Embodiment]

The present invention is employed to a vertical type MOS field effect transistor (hereinafter, referred to as a VMOS) 5 in this third embodiment. Portions in the VMOS 5 that are different from the VMOS 1 and VMOS 3 will be explained while explanation of the same or similar portions to the first embodiment will be omitted.

In the peripheral region, P-type single crystal silicon regions 15 are divided into an upper portion and a lower portion by an N-type single crystal silicon region 43, respectively. N-type single crystal silicon regions 17 are electrically conducted with each other through the N-type single crystal silicon regions 43. Impurity concentration of the N-type single crystal silicon regions 43 may be the same as the N-type single crystal silicon regions 17, or may be different from the N-type single crystal silicon regions 17. Hereinafter, a manufacturing method of the N-type single crystal silicon regions 43 will be described. The super junction structure 13 is formed by repeating selective implantation of N-type impurity and P-type impurity in an epitaxial layer after the epitaxial layer is formed. The N-type single crystal silicon regions 43 are formed in the repeated process as described above. Namely, after an epitaxial layer where the N-type single crystal silicon regions 43 is to be formed is formed, an N-type impurity is implanted in whole of the peripheral region 13b to form the N-type single crystal silicon regions 43 and a part of the N-type single crystal silicon regions 17.

According to the third embodiment, in an off state of the VMOS 5, a depletion layer is divided into a vertical and a lateral electric fields. A leak current is reduced by, especially, the lateral electric field in a low voltage. Moreover, according to a simulation, when the voltage is at 50 V or less, the leak current is reduced to ⅓ from that of a conventional structure.

[Simulation]

Figure 2:
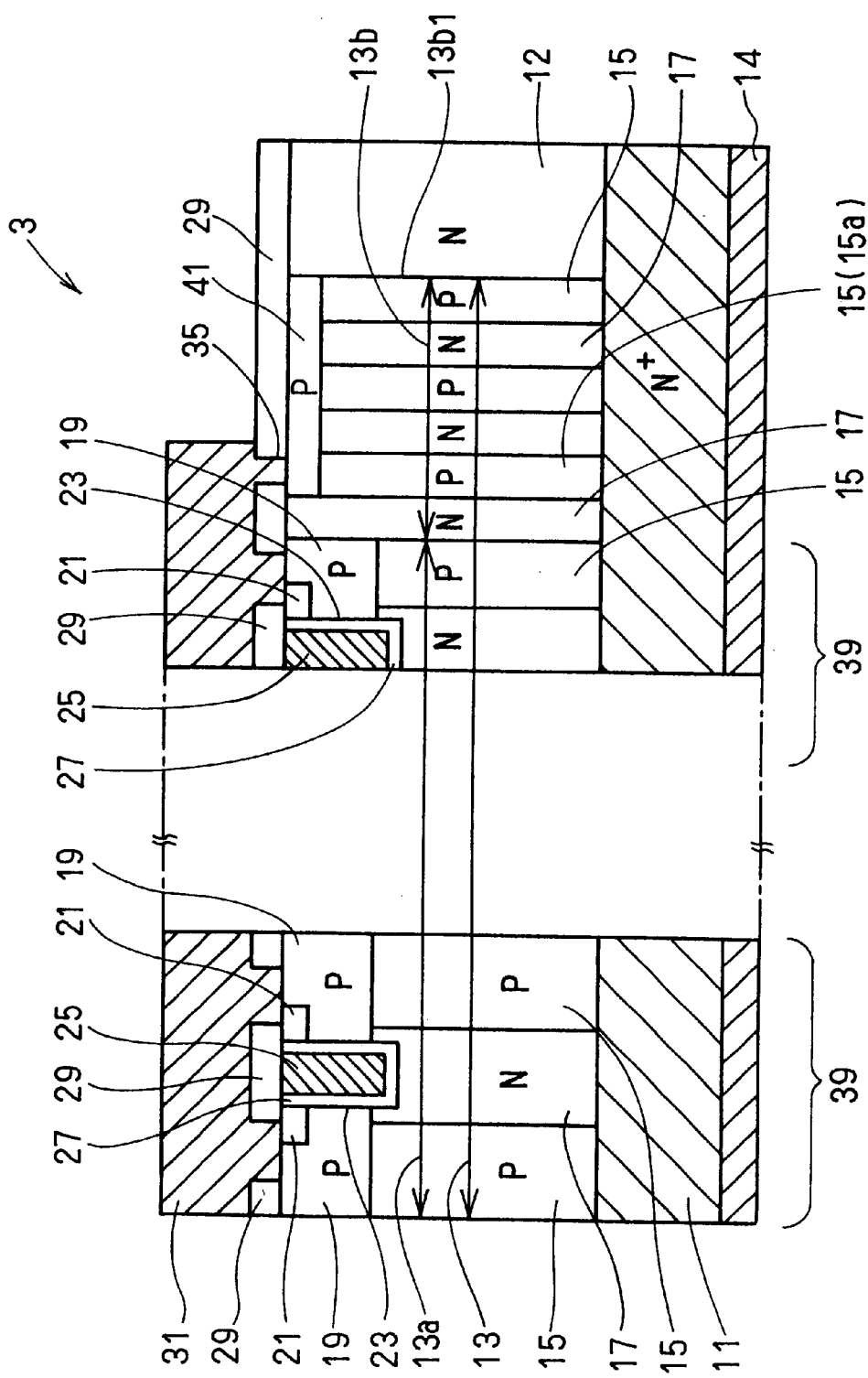
FIG. 2 is a schematic cross sectional view of a semiconductor device in a second embodiment of the present invention.
Figure 3:
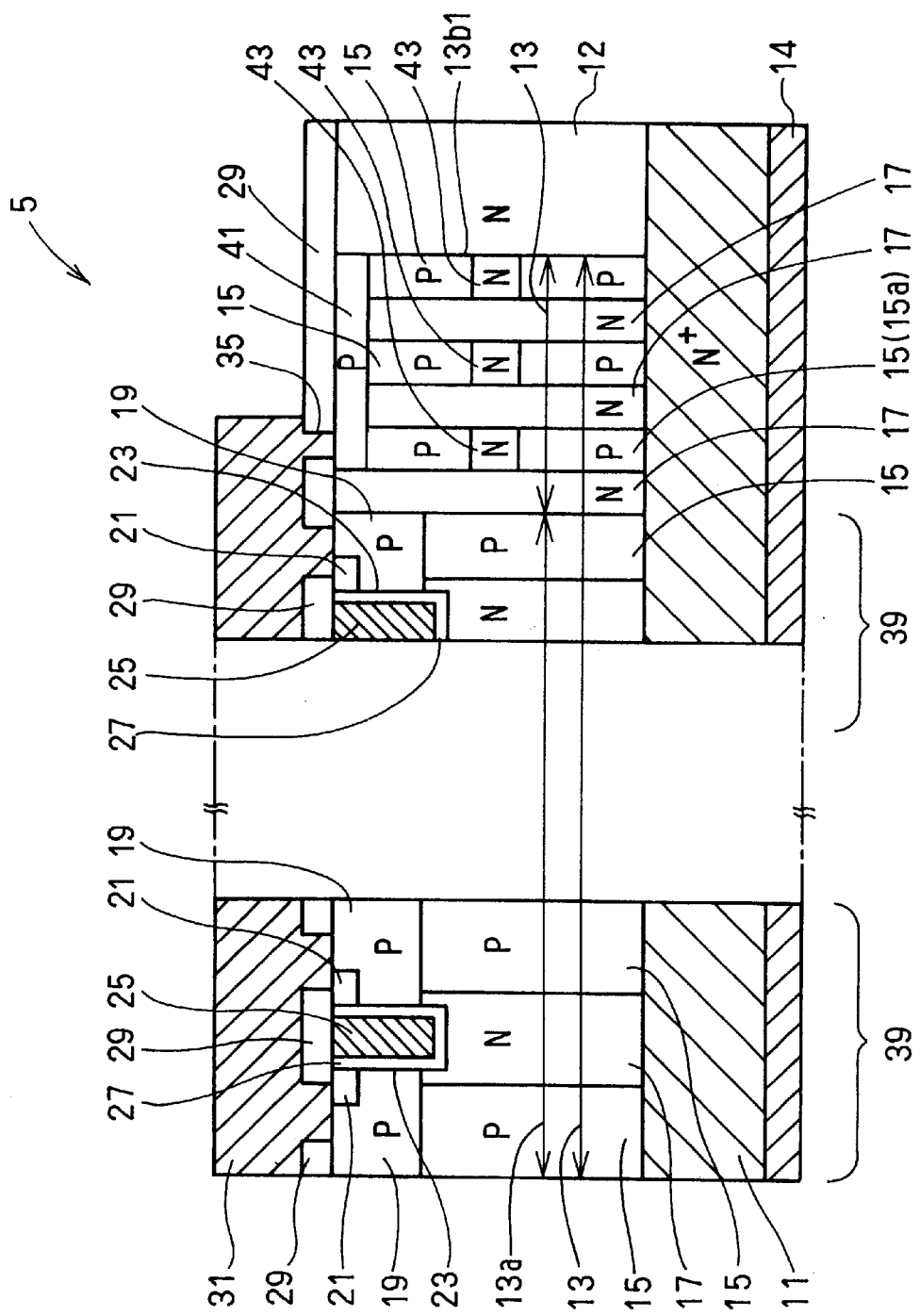
FIG. 3 is a schematic cross sectional view of a semiconductor device in a third embodiment of the present invention.
Figure 11A:
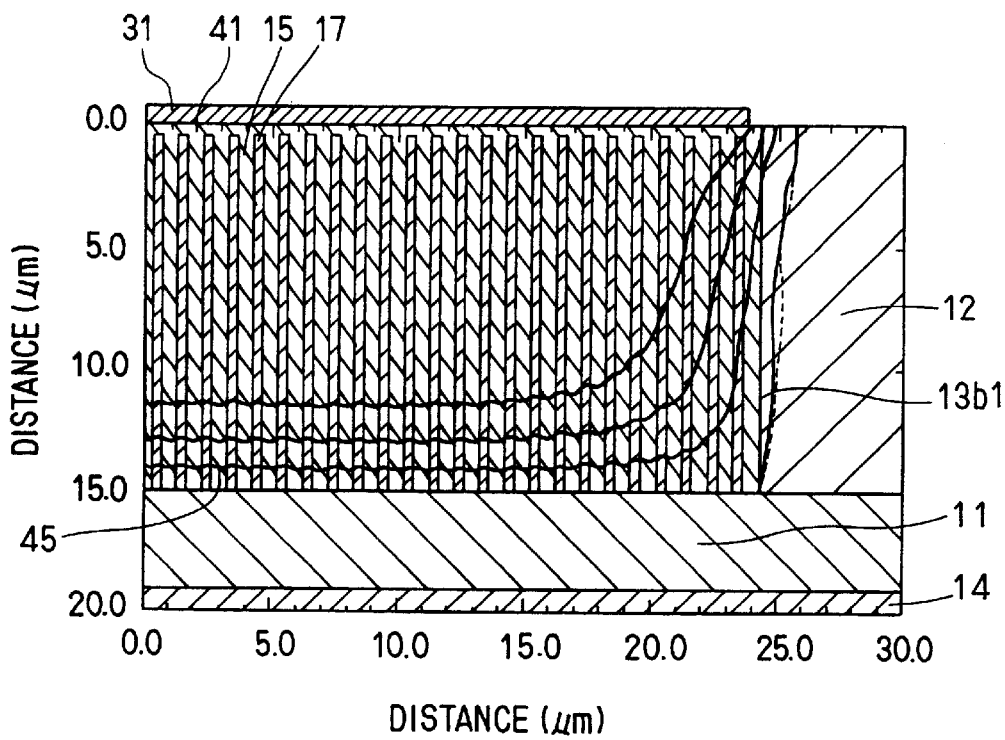
FIG. 11A is a schematic cross sectional view of a super junction structure in the semiconductor device to explain a simulation result of a compared example.
Figure 12A:
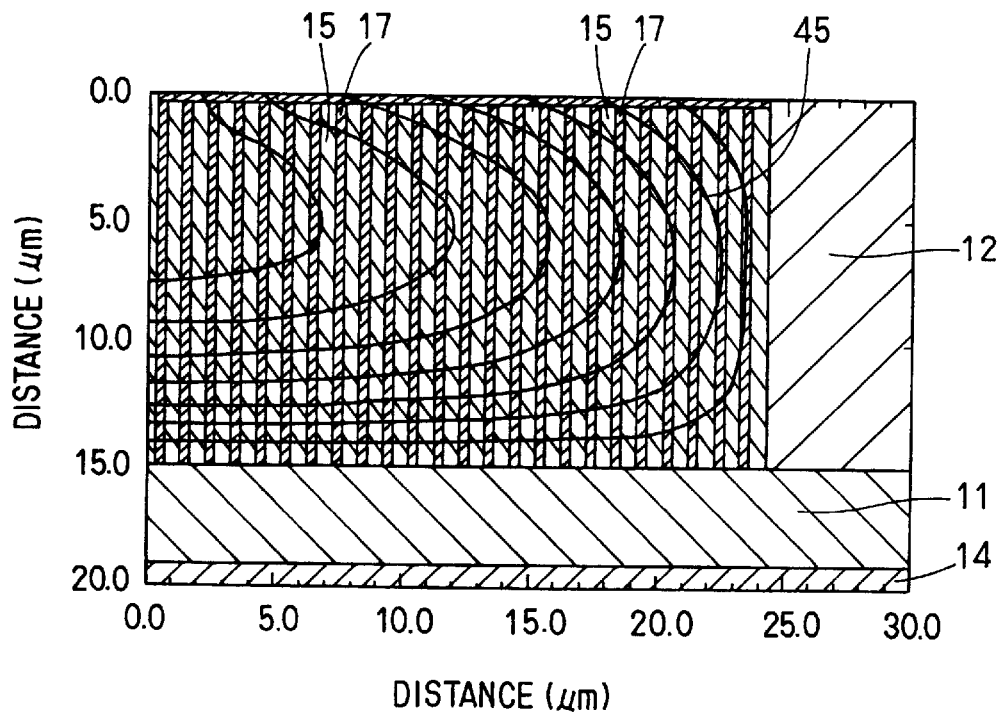
FIG. 12A is a schematic cross sectional view of a super junction structure in the semiconductor device to explain a simulation result of the related art.

Simulations are conducted on the peripheral regions in the super junction structures that are shown in FIGS. 4A, 5A, 6A, 7A, 8A, 9A, 10A, 11A, and 12A. The peripheral region (ex. 1) shown in FIG. 4A corresponds to the vertical type MOS field effect transistor 1. The peripheral region (ex. 2) shown in FIG. 5A, the peripheral region (ex. 3) shown in FIG. 6A, and the peripheral region (ex. 4) shown in FIG. 7A correspond to the vertical type MOS field effect transistor 3. The peripheral region (ex. 5) shown in FIG. 8A, the peripheral region (ex. 6) shown in FIG. 9A, and the peripheral region (ex. 7) shown in FIG. 10A correspond to the vertical type MOS field effect transistor 5. The peripheral region (ex. 8) shown in FIG. 11A is a compared example. The peripheral region (ex. 9) shown in FIG. 12A is an example in the related art. Incidentally, numerals shown in FIGS. 4A, 5A, 6A, 7A, 8A, 9A, 10A, 11A, and 12A designate the same or similar parts shown in FIGS. 1 to 3.

[Condition of the peripheral region]

(A condition of the peripheral region in ex. 1)

An n-type impurity concentration in the N$^+$-type drain region 11 is at $1 \times 10^{19}/cm^3$;

An n-type impurity concentration in the N-type single crystal silicon regions 12 and 17 is at $1 \times 10^{16}/cm^3$;

A p-type impurity concentration in the P-type single crystal silicon region 15(15a) is at $1 \times 10^{16}/cm^3$;

A width of the N-type single crystal silicon regions 17 is at 0.5 μm;

A depth of the N-type single crystal silicon regions 17 is at 15 μm;

A width of the P-type single crystal silicon regions 15, 15(15a) is at 0.5 μm; and A depth of the P-type single crystal silicon regions 15, 15(15a) is at 15 μm.

(A condition of the peripheral region in exs. 2 to 4)

Figure 5A:
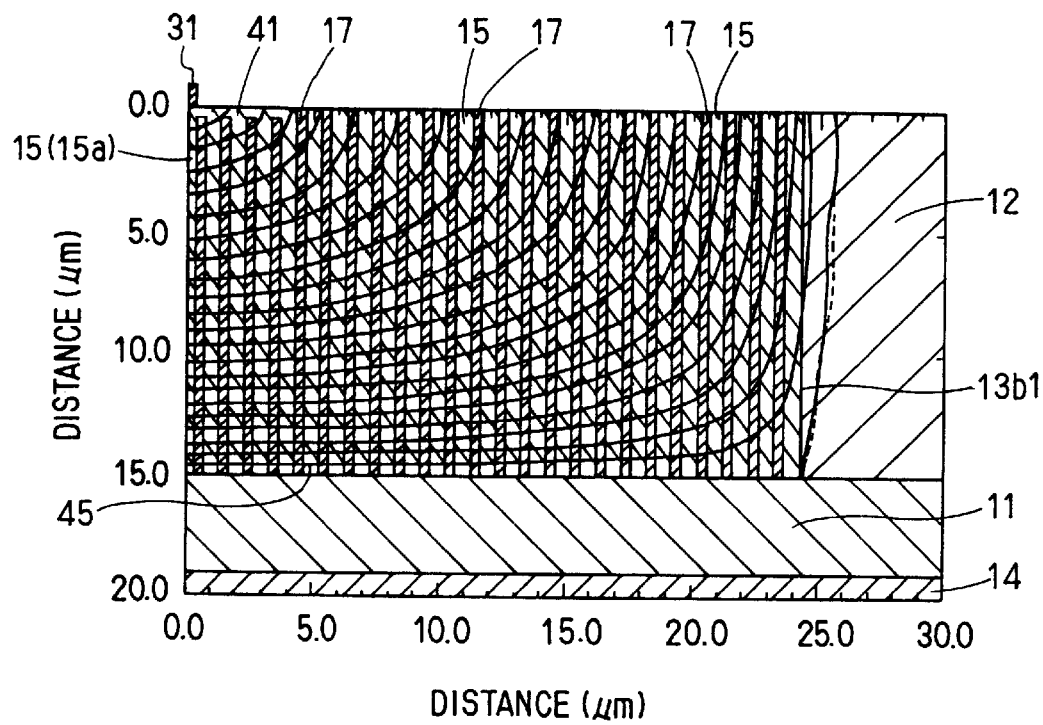
FIG. 5A is a schematic cross sectional view of a super junction structure in the semiconductor device to explain a simulation result of the embodiment.
Figure 6A:
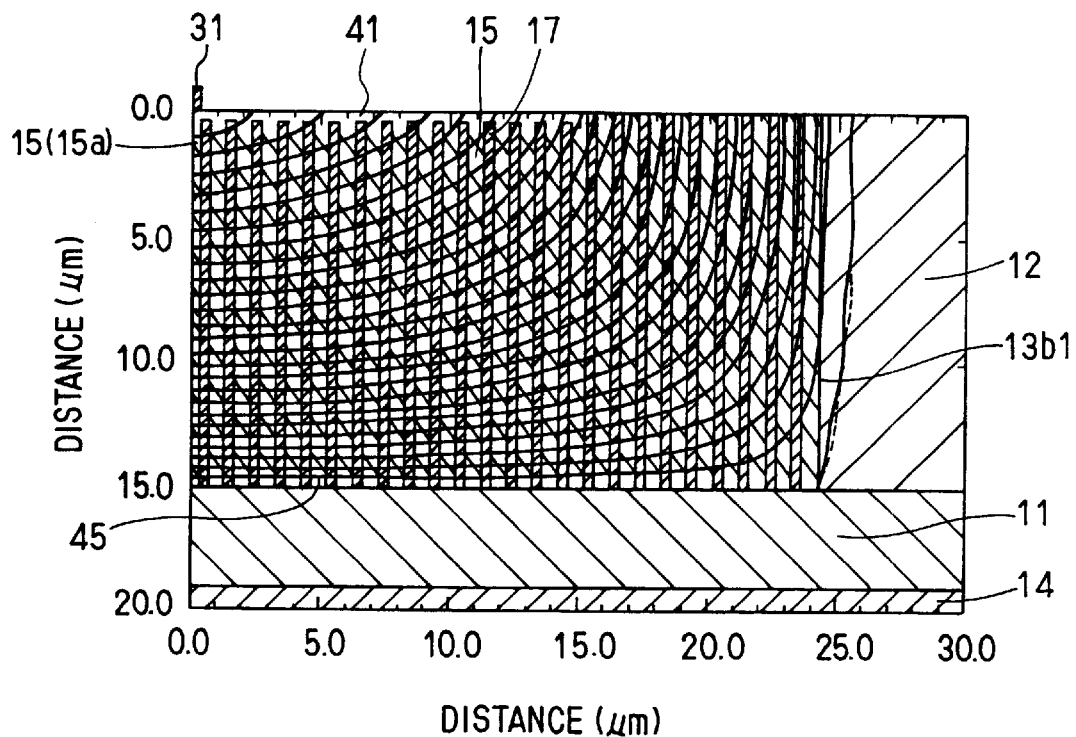
FIG. 6A is a schematic cross sectional view of a super junction structure in the semiconductor device to explain a simulation result of the embodiment.
Figure 7A:
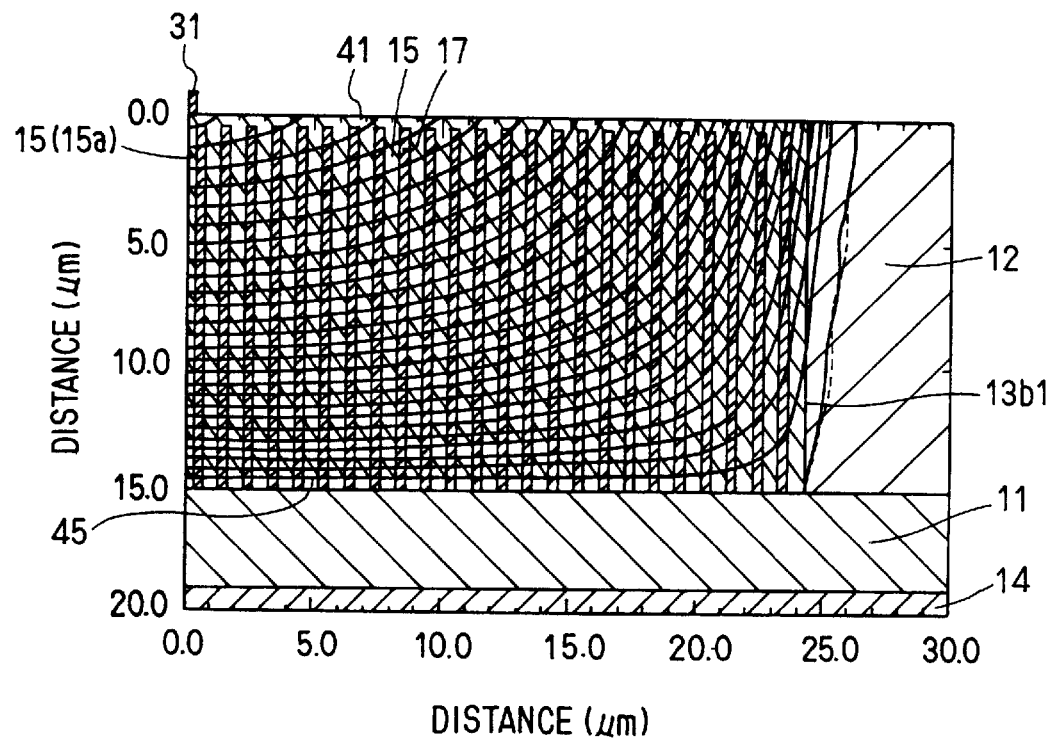
FIG. 7A is a schematic cross sectional view of a super junction structure in the semiconductor device to explain a simulation result of the embodiment.

An n-type impurity concentration in the N$^+$-type drain region 11 is at $1 \times 10^{19}/cm^3$;

An n-type impurity concentration in the N-type single crystal silicon regions 12 and 17 is at $1\times10^{16}/cm^3$;

A p-type impurity concentration in the P-type single crystal silicon region 15(15a) is at $1\times10^{16}/cm^3$;

A width of the N-type single crystal silicon regions 17 is at 0.5 μm;

A depth of the N-type single crystal silicon regions 17 is at 14.5, 15 μm;

A width of the P-type single crystal silicon regions 15, 15(15a) is at 0.5 μm;

A depth of the P-type single crystal silicon regions 15, 15(15a) is at 14.5, 15 μm;

A depth of the P-type single crystal silicon region 41 is at 0.5 μm;

A transverse length of the P-type single crystal silicon region 41 is at 5.0 μm in FIG. 5A;

A transverse length of the P-type single crystal silicon region 41 is at 15 μm in FIG. 6A; and A transverse length of the P-type single crystal silicon region 41 is at 25 μm in FIG. 7A.

(A condition of the peripheral region in exs. 5 to 7)

An n-type impurity concentration in the N+-type drain region 11 is at $1\times10^{19}/cm^3$;

An n-type impurity concentration in the N-type single

A p-type impurity concentration in the P-type single crystal silicon regions 15 is at $1\times10^{16}/cm^3$;

A width of the N-type single crystal silicon regions 17 is at 1.0 μm;

A depth of the N-type single crystal silicon regions 17 is at 14 μm;

A width of the P-type single crystal silicon regions 15 is at 1.0 μm;

A depth of the P-type single crystal silicon regions 15, 15(15a) is at 14 μm;

A depth of the P-type single crystal silicon region 41 is at 1.0 μm;

A transverse length of the P-type single crystal silicon region 41 is at 25 μm in FIGS. 8A to 10A;

A width of the N-type single crystal silicon regions 43 is at 1.0 μm in FIGS. 8A to 10A; and A depth of the N-type single crystal silicon regions 43 is at 1.0 μm in FIGS. 8A to 10A.

(A condition of the peripheral region in ex. 8)

An n-type impurity concentration in the N+-type drain region 11 is at $1\times10^{19}/cm^3$;

An n-type impurity concentration in the N-type single crystal silicon regions 12 and 17 is at $1\times10^{16}/cm^3$;

A p-type impurity concentration in the P-type single crystal silicon region 15(15a) is at $1\times10^{16}/cm^3$;

A width of the N-type single crystal silicon regions 17 is at 0.5 μm;

A depth of the N-type single crystal silicon regions 17 is at 14.5 μm;

A width of the P-type single crystal silicon regions 15 is at 0.5 μm;

A depth of the P-type single crystal silicon regions 15 is at 14.5 μm;

A depth of the P-type single crystal silicon region 41 is at 0.5 μm; and

A transverse length of the P-type single crystal silicon region 41 is at 25 μm.

(A condition of the peripheral region in ex. 9)

An n-type impurity concentration in the N+-type drain region 11 is at $1\times10^{19}/cm^3$;

An n-type impurity concentration in the N-type single crystal silicon regions 12 and 17 is at $1\times10^{16}/cm^3$;

A p-type impurity concentration in the P-type single crystal silicon region 15 is at $1\times10^{16}/cm^3$;

A width of the N-type single crystal silicon regions 17 is at 0.5 μm;

A depth of the N-type single crystal silicon regions 17 is at 14.5 μm;

A width of the P-type single crystal silicon regions 15 is at 0.5 μm; and

A depth of the P-type single crystal silicon regions 15 is at 14.5 μm.

[Withstand Voltage Characteristic]

Simulations in the above-mentioned super junction structures are conducted over withstand voltage characteristic (a relationship between a drain voltage Vd and a drain current Id). The results are shown in graphs in FIGS. 4B to 12B. Incidentally, conditions are described as follows.

A gate voltage is at 0 V;

A drain voltage is increased every 0.5 V from 0V to 300V;

A source voltage is at 0 V; and

A body voltage is at 0 V.

Figure 4A:
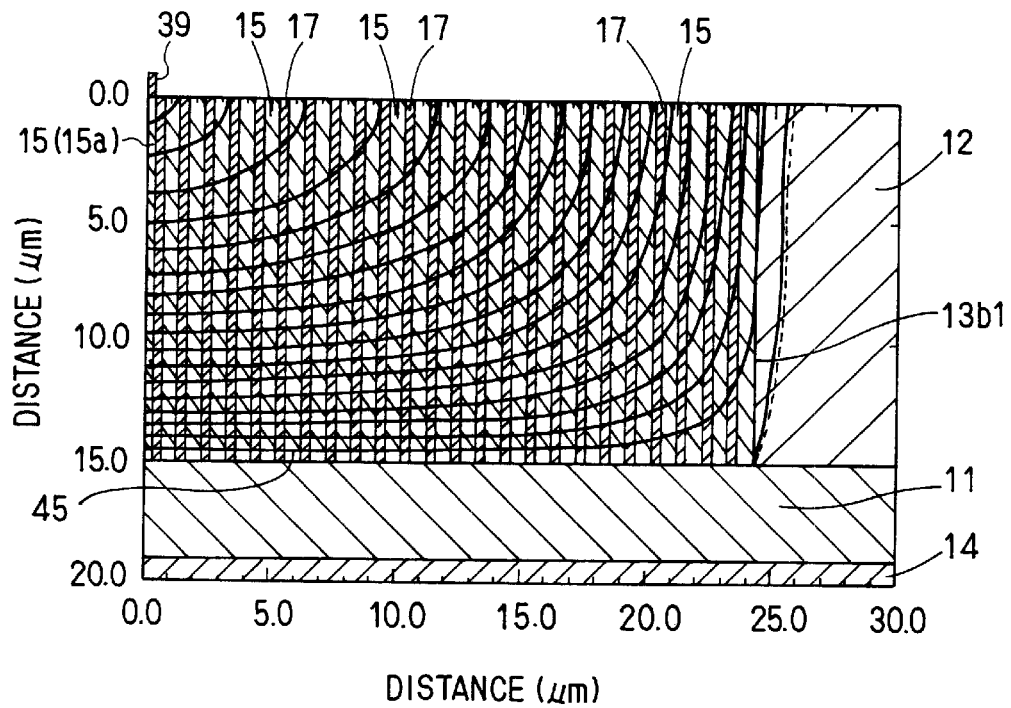
FIG. 4A is a schematic cross sectional view of a super junction structure in the semiconductor device to explain a simulation result of the embodiment.
Figure 4B:
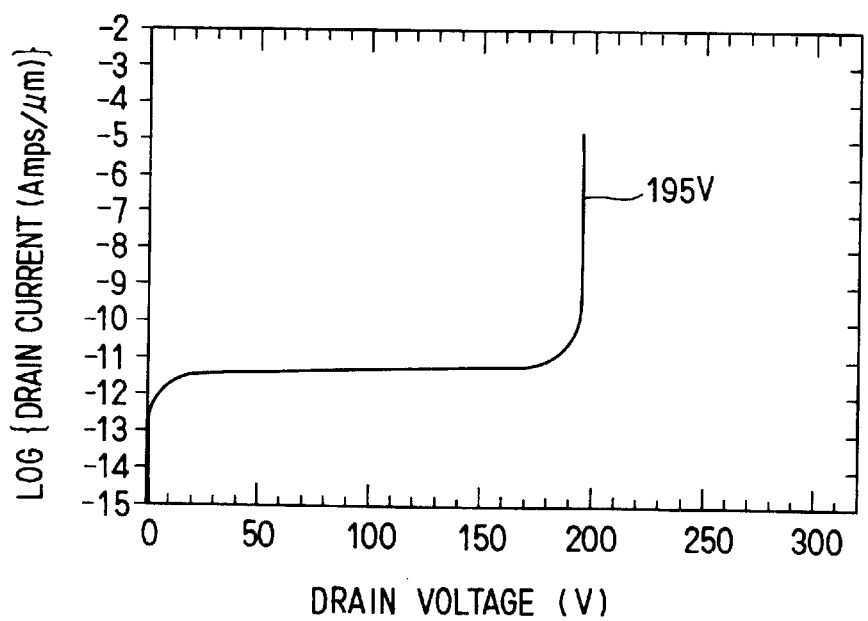
FIG. 4B is a graph showing a relationship between a drain voltage Vd and a drain current Id of a simulation model (ex. 1) shown in FIG. 4A.

FIG. 4B shows the withstand voltage characteristic of the super junction structure in the ex. 1. As can be understood from FIG. 4B, a dielectric breakdown occurs in the device at 195 V in the drain voltage. Therefore, the withstand voltage of the peripheral region is 195 V in the above-mentioned condition. Incidentally, the numeral 45 designates equipotential lines in FIG. 4A, and these lines shows an electric potential distribution at 190 V in the drain voltage in the off state of the vertical type MOS field effect transistor including the peripheral region of a super junction structure in the ex. 1. A step between each of the equipotential lines 45 is 10 V. As can be understood from FIG. 4A, the equipotential lines 45 are distributed in whole of the peripheral region of the super junction. This situation denotes that the peripheral region is completely depleted. As such, it is understood that a dielectric breakdown does not occur in the device at 190 V in the drain voltage since the depletion layer exist in the peripheral region of the super junction structure.

Figure 5B:
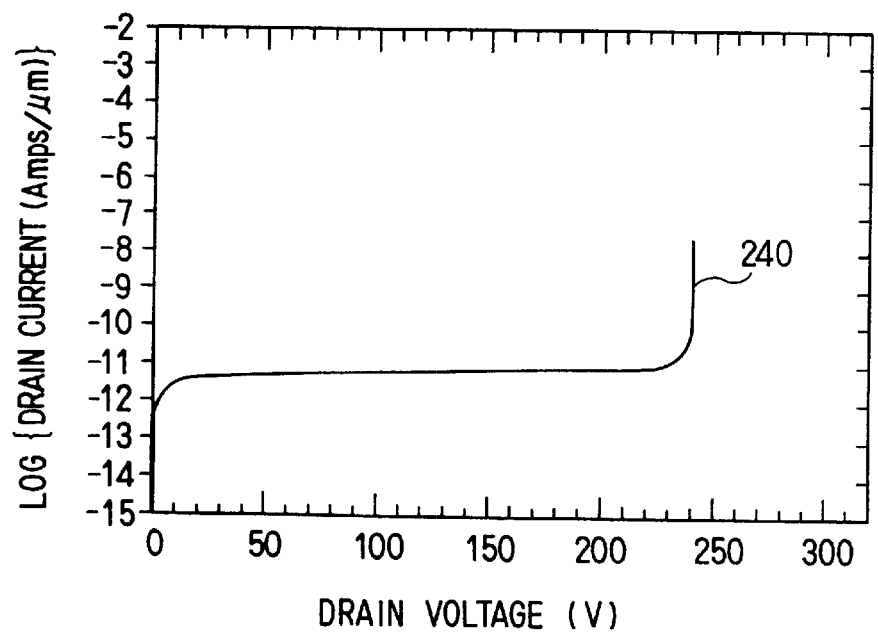
FIG. 5B is a graph showing a relationship between a drain voltage Vd and a drain current Id of a simulation model (ex. 2) shown in FIG. 5A.

FIG. 5B shows the withstand voltage characteristic of the super junction structure in the ex. 2. As can be understood from FIG. 5B, the withstand voltage of the peripheral region is 240 V in the above-mentioned condition. Incidentally, the numeral 45 designates equipotential lines in FIG. 5A, and these lines shows an electric potential distribution at 230 V in the drain voltage in the off state of the vertical type MOS field effect transistor including the peripheral region of super junction structure in the ex. 2. As such, it is understood that a dielectric breakdown does not occur in the device at 230 V in the drain voltage since the depletion layer exist in the peripheral region of the super junction structure.

Figure 6B:
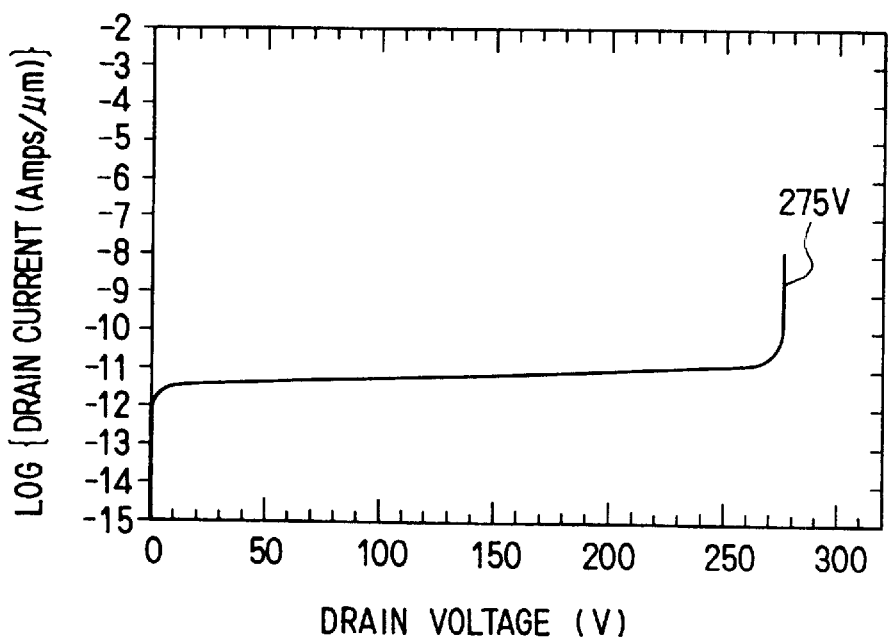
FIG. 6B is a graph showing a relationship between a drain voltage Vd and a drain current Id of a simulation model (ex. 3) shown in FIG. 6A.

FIG. 6B shows the withstand voltage characteristic of the super junction structure in the ex. 3. ex. As can be understood from FIG. 6B, the withstand voltage of the peripheral region is 275 V in the above-mentioned condition. Incidentally, the numeral 45 designates equipotential lines in FIG. 6A, and these lines shows an electric potential distribution at 270 V in the drain voltage in the off state of the vertical type MOS field effect transistor including the peripheral region of super junction structure in the ex. 3. As such, it is understood that a dielectric breakdown does not occur in the device at 270 V in the drain voltage since the depletion layer exist in the peripheral region of the super junction structure.

Figure 7B:
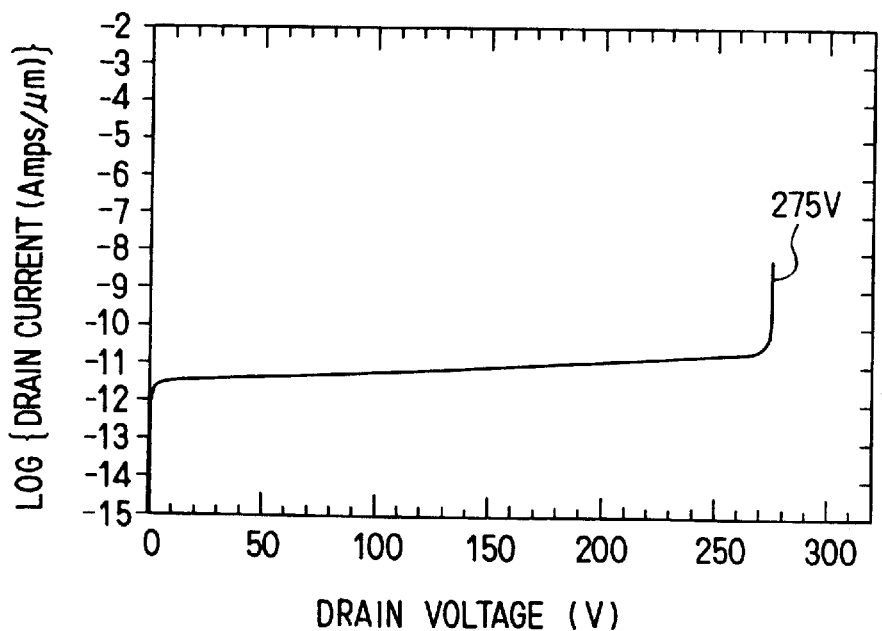
FIG. 7B is a graph showing a relationship between a drain voltage Vd and a drain current Id of a simulation model (ex. 4) shown in FIG. 7A.

FIG. 7B shows the withstand voltage characteristic of the super junction structure in the ex. 4. As can be understood from FIG. 7B, the withstand voltage of the peripheral region is 275 V in the above-mentioned condition. Incidentally, the numeral 45 designates equipotential lines in FIG. 7A, and these lines shows an electric potential distribution at 270 V in the drain voltage in the off state of the vertical type MOS field effect transistor including the peripheral region of super junction structure in the ex. 4. As such, it is understood that a dielectric breakdown does not occur in the device at 270 V in the drain voltage since the depletion layer exist in the peripheral region of the super junction structure.

Figure 8A:
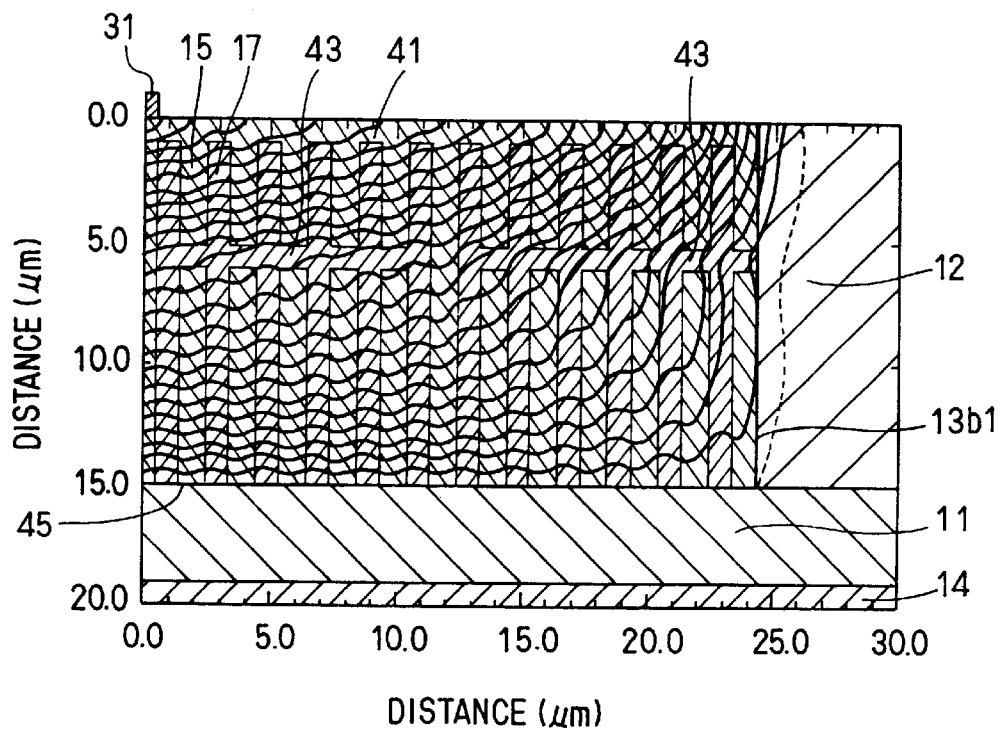
FIG. 8A is a schematic cross sectional view of a super junction structure in the semiconductor device to explain a simulation result of the embodiment.
Figure 8B:
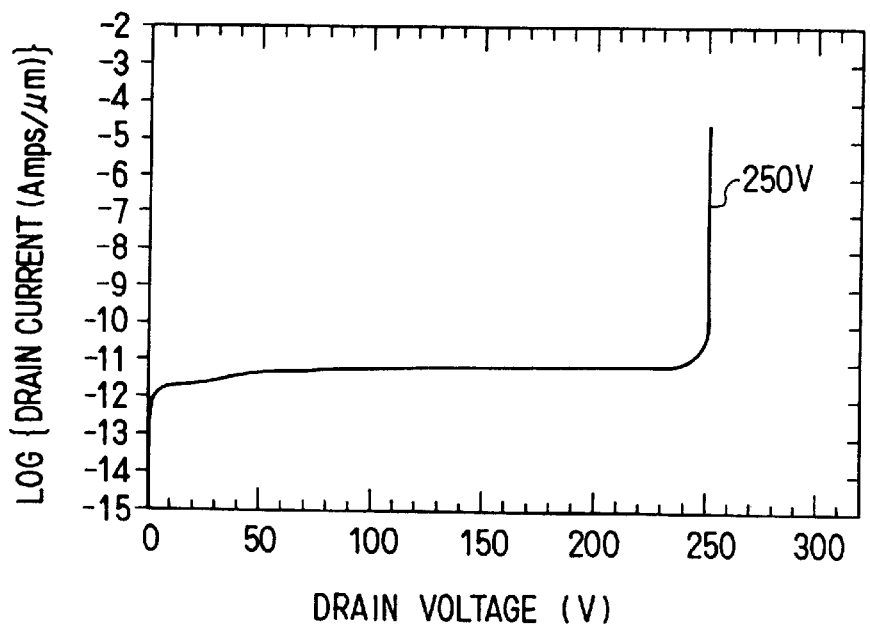
FIG. 8B is a graph showing a relationship between a drain voltage Vd and a drain current Id of a simulation model (ex. 5) shown in FIG. 8A.

FIG. 8B shows the withstand voltage characteristic of the super junction structure in the ex. 5. As can be understood from FIG. 8B, the withstand voltage of the peripheral region is 250 V in the above-mentioned condition. Incidentally, the numeral 45 designates equipotential lines in FIG. 8A, and these lines shows an electric potential distribution at 240 V in the drain voltage in the off state of the vertical type MOS field effect transistor including the peripheral region of super junction structure in the ex. 5. As such, it is understood that a dielectric breakdown does not occur in the device at 240 V in the drain voltage since the depletion layer exist in the peripheral region of the super junction structure.

Figure 9A:
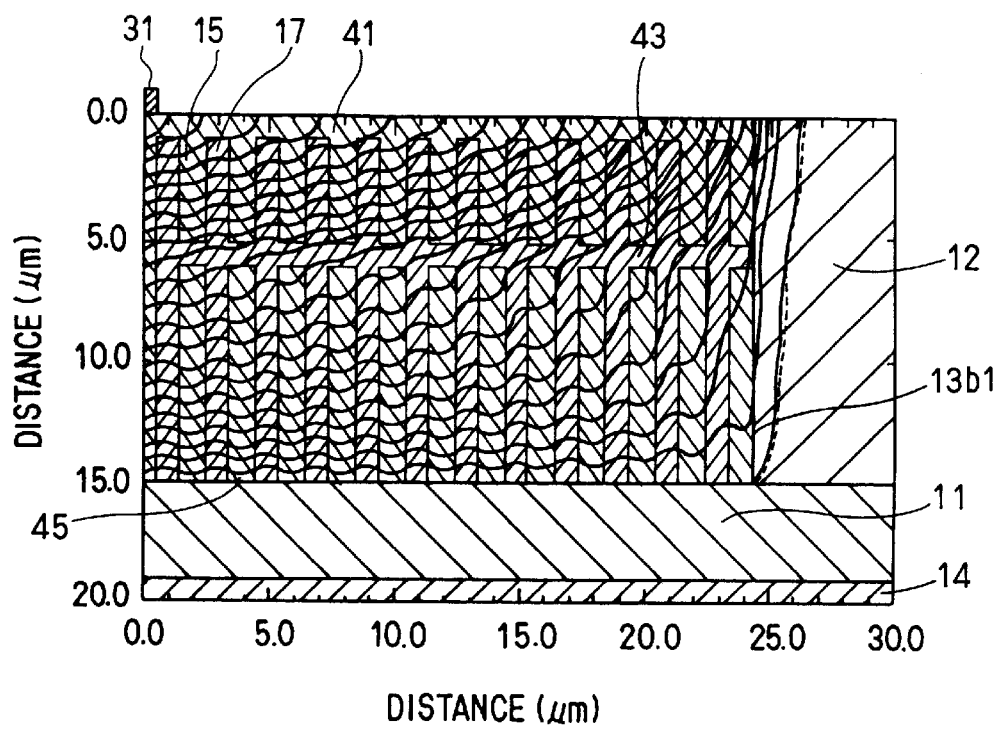
FIG. 9A is a schematic cross sectional view of a super junction structure in the semiconductor device to explain a simulation result of the embodiment.
Figure 9B:
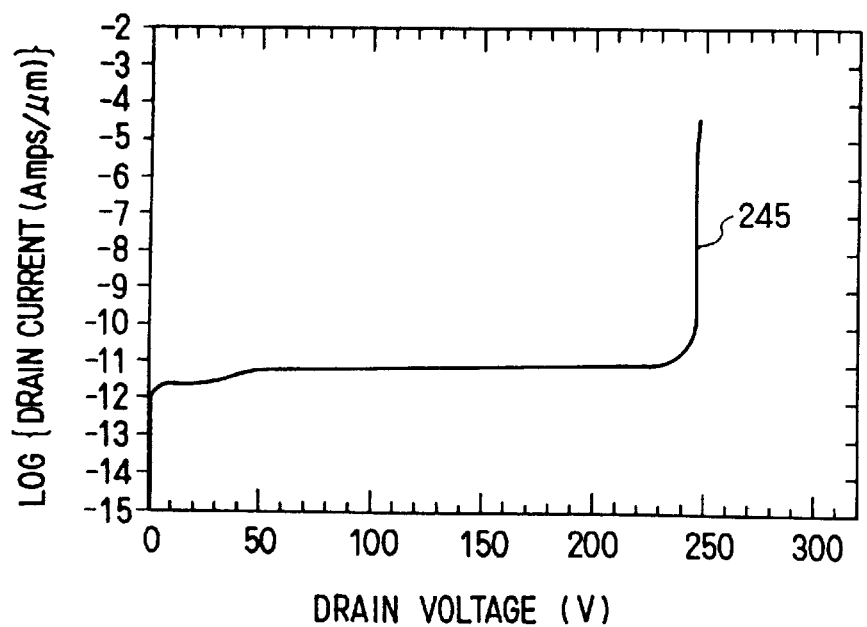
FIG. 9B is a graph showing a relationship between a drain voltage Vd and a drain current Id of a simulation model (ex. 6) shown in FIG. 9A.

FIG. 9B shows the withstand voltage characteristic of the super junction structure in the ex. 6. As can be understood from FIG. 9B, the withstand voltage of the peripheral region is 245 V in the above-mentioned condition. Incidentally, the numeral 45 designates equipotential lines in FIG. 9A, and these lines shows an electric potential distribution at 240 V in the drain voltage in the off state of the vertical type MOS field effect transistor including the peripheral region of super junction structure in the ex. 6. As such, it is understood that a dielectric breakdown does not occur in the device at 240 V in the drain voltage since the depletion layer exist in the peripheral region of the super junction structure.

Figure 10A:
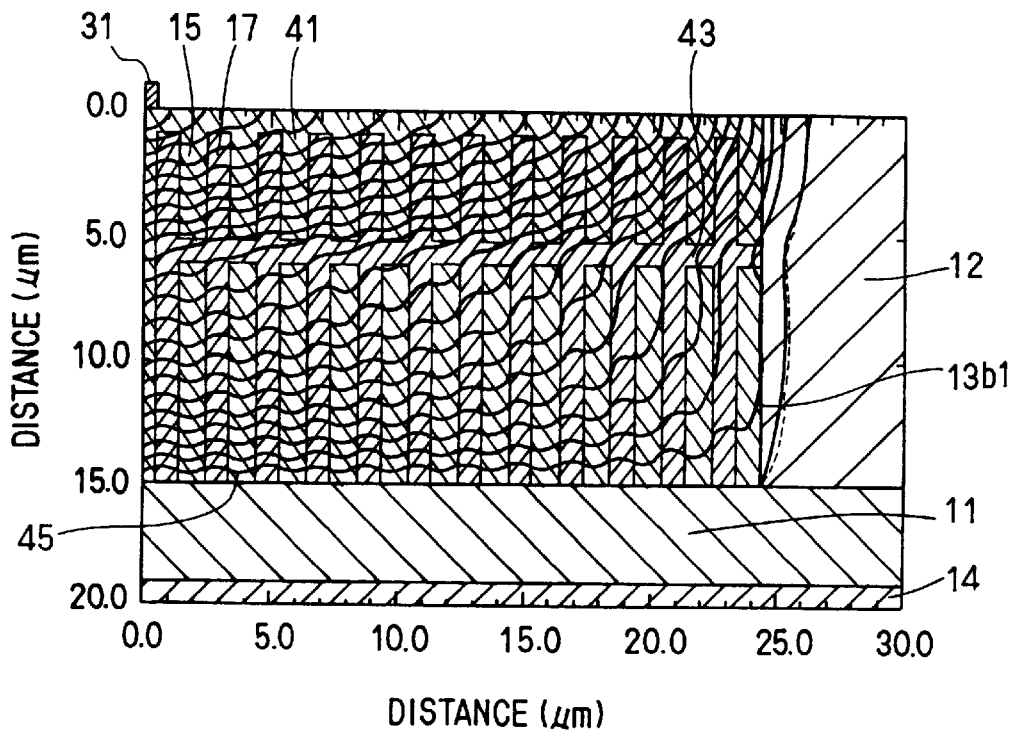
FIG. 10A is a schematic cross sectional view of a super junction structure in the semiconductor device to explain a simulation result of the embodiment.
Figure 10B:
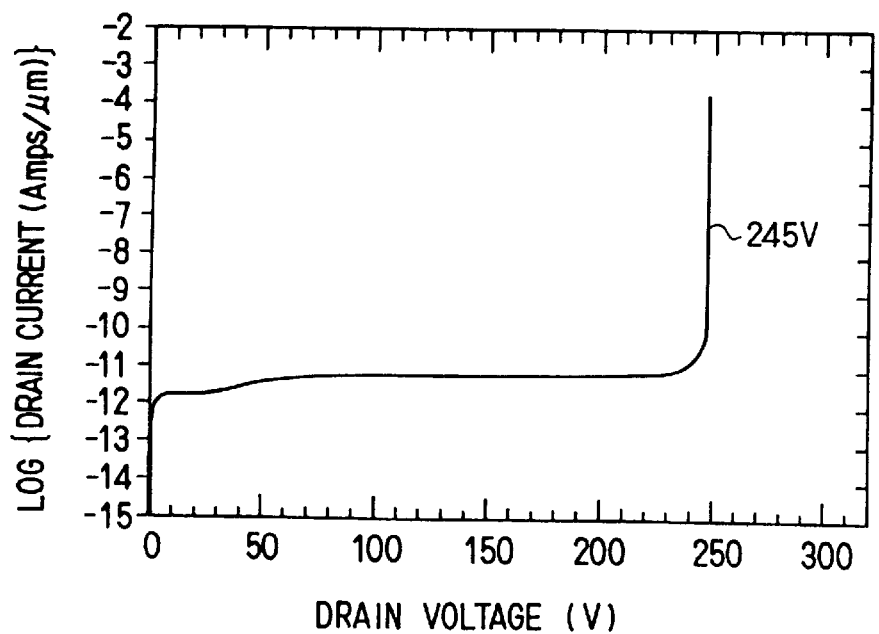
FIG. 10B is a graph showing a relationship between a drain voltage Vd and a drain current Id of a simulation model (ex. 7) shown in FIG. 10A.

FIG. 10B shows the withstand voltage characteristic of the super junction structure in the ex. 7. As can be understood from FIG. 10B, the withstand voltage of the peripheral region is 245 V in the above-mentioned condition. Incidentally, the numeral 45 designates equipotential lines in FIG. 10A, and these lines shows an electric potential distribution at 240 V in the drain voltage in the off state of the vertical type MOS field effect transistor including the peripheral region of super junction structure in the ex. 7. As such, it is understood that a dielectric breakdown does not occur in the device at 240 V in the drain voltage since the depletion layer exist in the peripheral region of the super junction structure.

Figure 11B:
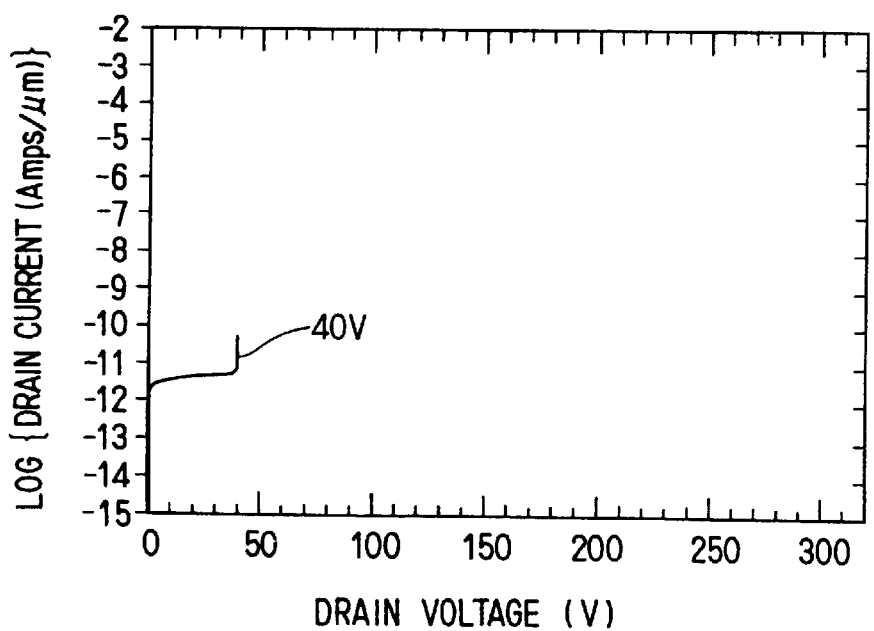
FIG. 11B is a graph showing a relationship between a drain voltage Vd and a drain current Id of a simulation model (ex. 8) shown in FIG. 11A.

In FIG. 11A, the electrode portion 31 extends approximately to the end portion of the peripheral region 13b. FIG. 11B shows the withstand voltage characteristic of the super junction structure in the ex. 8. As can be understood from FIG. 6B, the withstand voltage of the peripheral region is 40 V in the above-mentioned condition. Incidentally, the numeral 45 designates equipotential lines in FIG. 11A, and these lines shows an electric potential distribution approximately at 35 V in the drain voltage in the off state of the vertical type MOS field effect transistor including the peripheral region of super junction structure in the ex. 8. As such, it is understood that a dielectric breakdown does not occur in the device approximately at 35 V in the drain voltage since the depletion layer exist in the peripheral region of the super junction structure. Incidentally, the withstand voltage in the ex. 8 is lowered since the peripheral region of the super junction structure is not fully depleted.

Figure 12B:
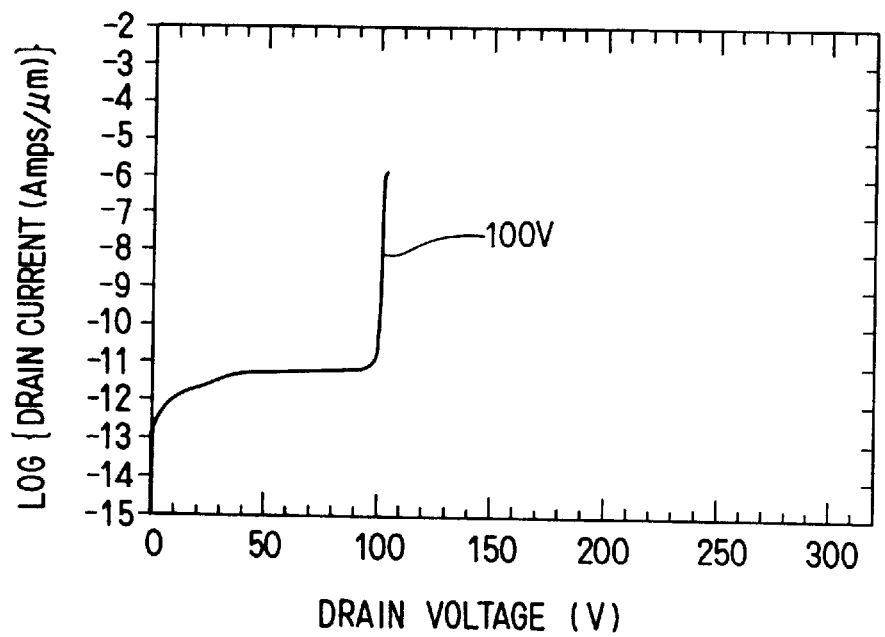
FIG. 12B is a graph showing a relationship between a drain voltage Vd and a drain current Id of a simulation model (ex. 9) shown in FIG. 12A.

FIG. 12B shows the withstand voltage characteristic of the super junction structure in the ex. 9. As can be understood from FIG. 12B, the withstand voltage of the peripheral region is 100 V in the above-mentioned condition. Incidentally, the numeral 45 designates equipotential lines in FIG. 12A, and these lines shows an electric potential distribution approximately at 95 V in the drain voltage in the off state of the vertical type MOS field effect transistor including the peripheral region of super junction structure in the ex. 9. As such, it is understood that a dielectric breakdown does not occur in the device approximately at 95 V in the drain voltage since the depletion layer exist in the peripheral region of the super junction structure.

Figure 13:
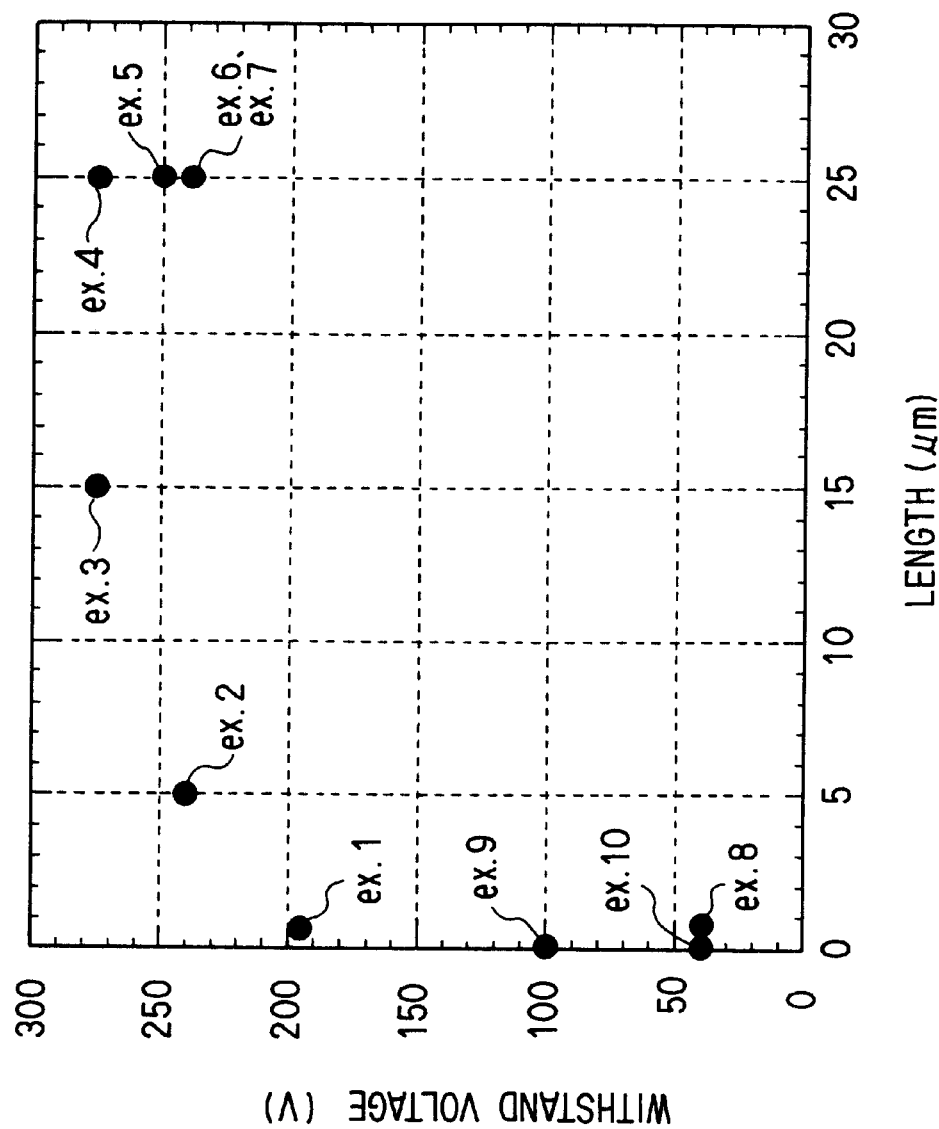
FIG. 13 is a graph showing withstand voltages in the respective super junction structures.

FIG. 13 shows the withstand voltages described above. A transverse axis denotes a length of the P-type single crystal silicon region 41 in a transverse direction. Although the P-type single crystal silicon region 41 does not exist in the ex. 1 (shown in FIG. 4A), the P-type single crystal silicon region 15(15a) is disposed at a surface portion. Therefore, a width of the P-type single crystal silicon region 15(15a) is regarded as the width of the P-type single crystal silicon region 41.

The ex. 10 shows a withstand voltage characteristic of the conventional type (a single-sided abrupt step junction). The withstand voltage of the single-sided abrupt step junction is determined by impurity concentration of a region where a depletion layer expands in a substrate. An n-type impurity concentration of the substrate is $1 \times 10^{16}/cm^3$, and according to Physics of Semiconductor Devices, S. M. Sze, page. 105, a theoretical maximum withstand voltage is approximately 60 V. An actual withstand voltage is determined by a distribution of an impurity concentration, i.e., a shape of a curvature of a diffused layer and a thickness of an epitaxial layer, so that the withstand voltage is at 60 V or less (approximately 40 V).

As can be understood from FIG. 13, the withstand voltages in the ex. 1 to ex. 7 are superior to those in the ex. 8 (compared example), ex. 9 (prior art), and ex. 10 (step junction). Moreover, when the P-type single crystal silicon region 41 is provided as shown in ex. 2 to ex. 7, the withstand voltage can be enhanced in comparison with the ex. 1 in which the P-type single crystal silicon region is not formed.

Figure 14:
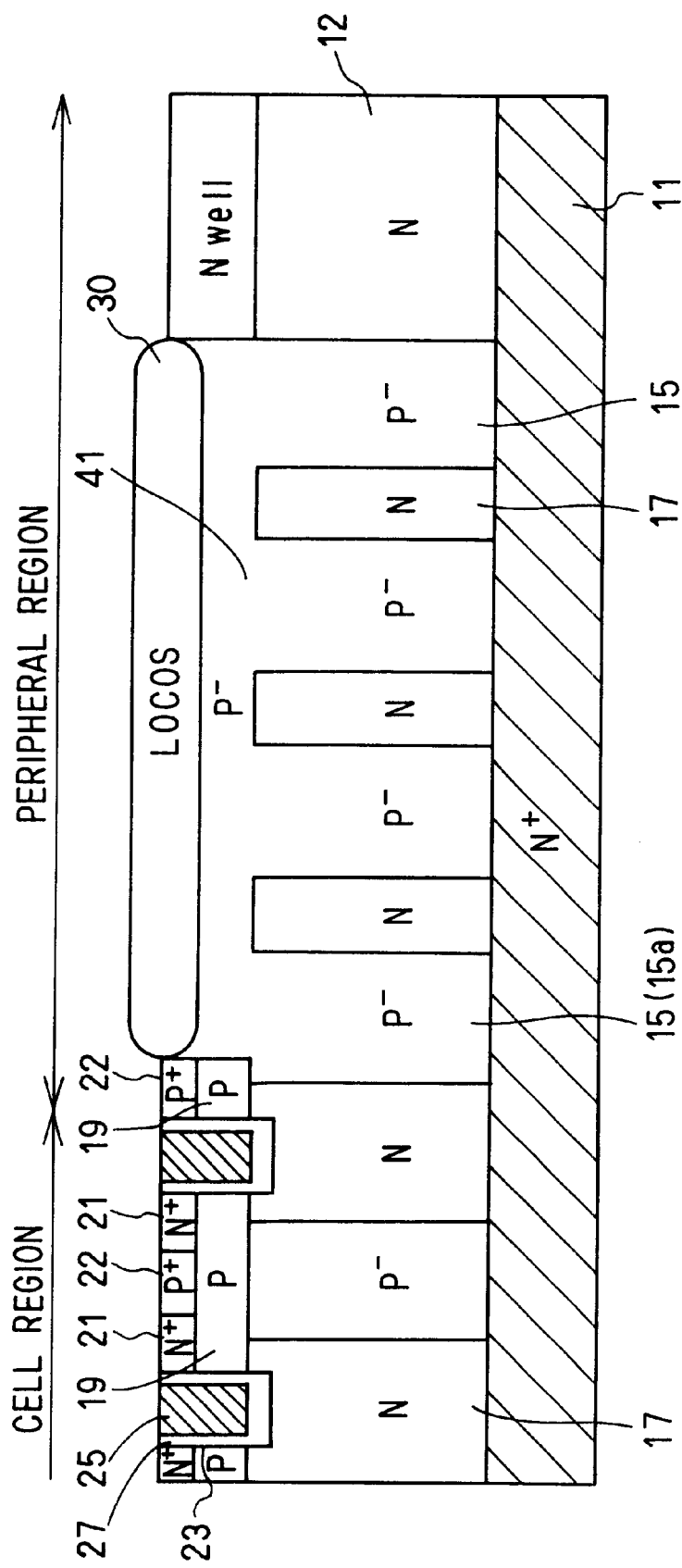
FIG. 14 is a schematic cross sectional view of a semiconductor device of the present invention.

Next, more specific structure of the vertical type MOS field effect transistor will be described with reference to FIG. 14. FIG. 14 shows a schematic cross sectional view of one of actual designs. First, N-type epitaxial layer (initial epi-layer) is formed on a silicon substrate ($N^+$-type drain region) 11, then, trenches are formed in the initial epi-layer so as to reach the silicon substrate to define N-type single crystal silicon regions 17. Next, trench epitaxial film is formed to fill the trenches and cover the N-type single crystal silicon regions 17, whereby P-type single crystal silicon regions 15, 15(15a) are provided. Then, whole area epitaxial layer is formed on the trench epitaxial film to form a P-type single crystal silicon region 41. Next, a LOCOS (LOCal Oxidation of Silicon) film 30 is formed. After that, a cell region is formed, that is, a P-type body (P-well) region 19, a trench 23, a gate oxidation film 27, a gate electrode, an $N^+$-type source region 21, $P^+$-type body contact region 22, drain and source electrodes (not shown) and the like are formed using well-known vertical type MOS process to provide the vertical type MOS field effect transistor.

Incidentally, a N-well region is formed on a N-type single crystal silicon region 12. The LOCOS film 30 is appropriate to regulate a thickness of the P-type single crystal silicon region 41. In this transistor, the P-type single crystal silicon region 41 is electrically connected to the source electrode (not shown) through the P-type body region 19 and the $P^+$-type body contact region 22 that are located next to the LOCOS film 30 in this figure. Although, width of the P-type single crystal silicon regions 15, 15(15a) is larger than that of the N-type single crystal silicon regions 17, the width of P-type single crystal silicon regions 15, 15(15a) and the N-type single crystal silicon regions 17 may be designed in such a manner that characteristics of a super junction structure is satisfied.

Next, more specific structure of the peripheral region 13b will be described with reference to FIGS. 15 to 17.

Figure 15:
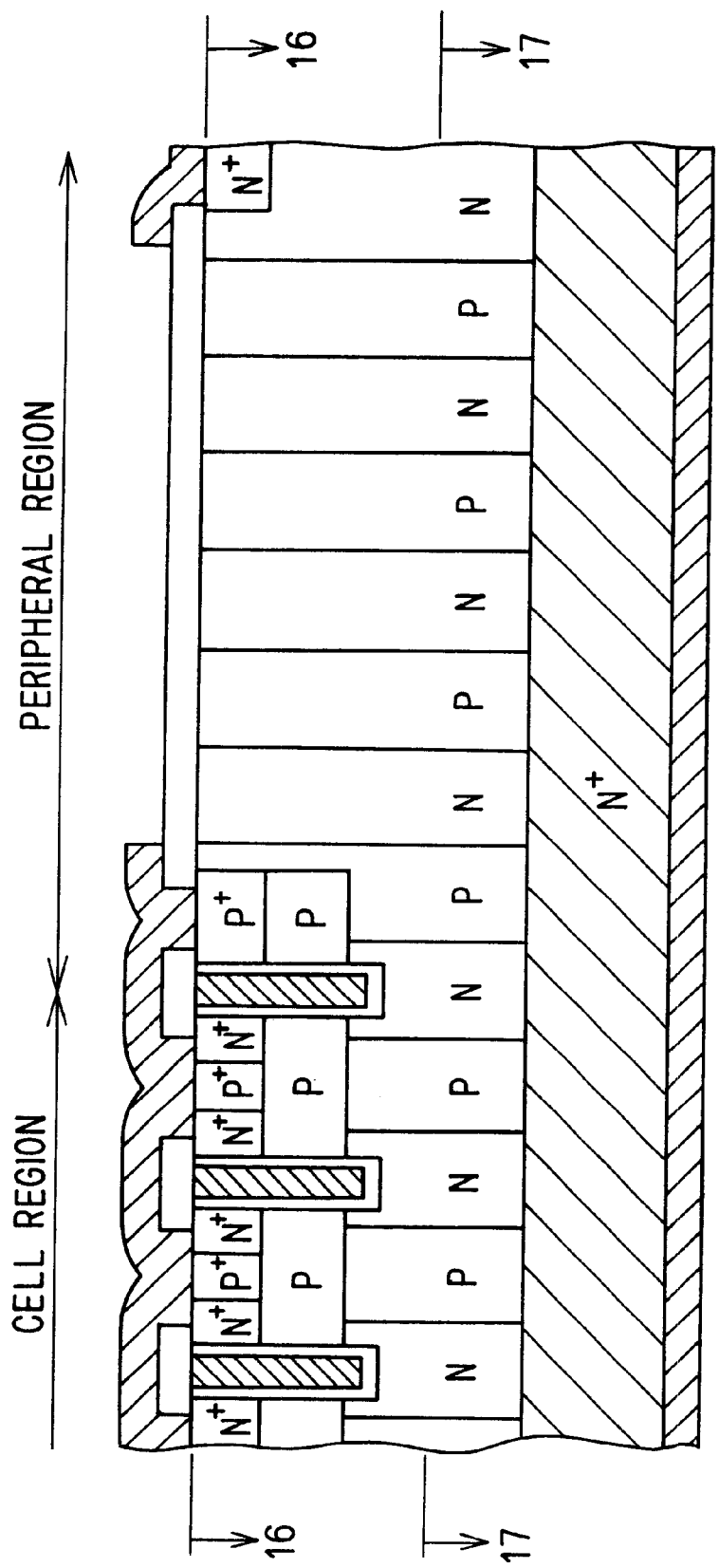
FIG. 15 is a schematic cross sectional view of a semiconductor device of the present invention.
Figure 16A:
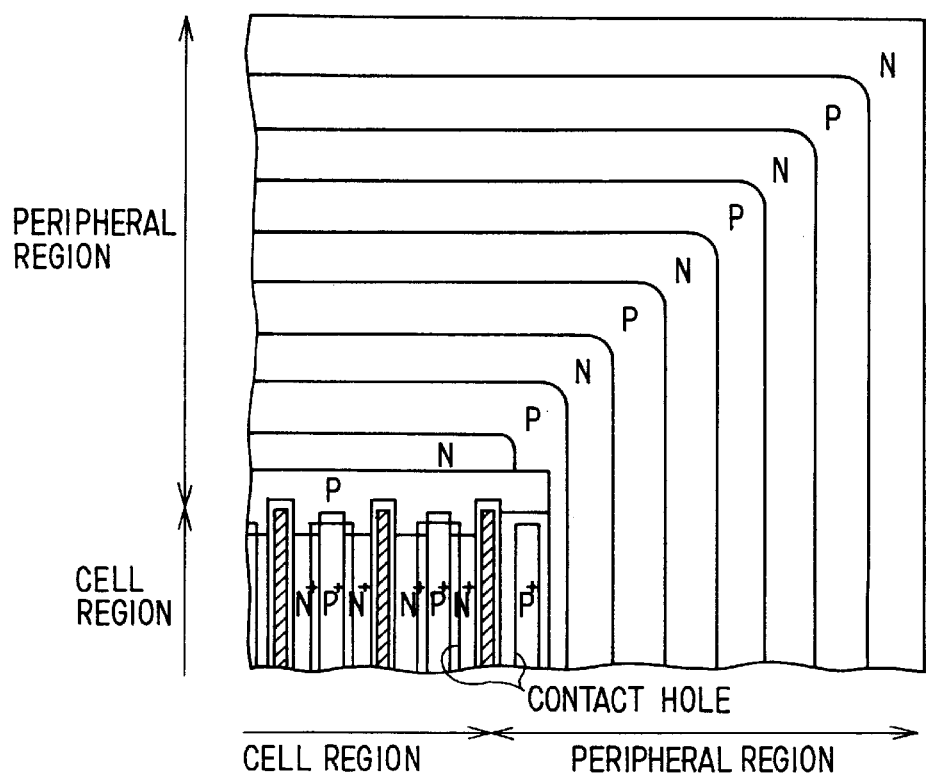
FIG. 16A is a cross sectional view taken along the plane indicated by line 16—16 in FIG. 15.
Figure 16B:
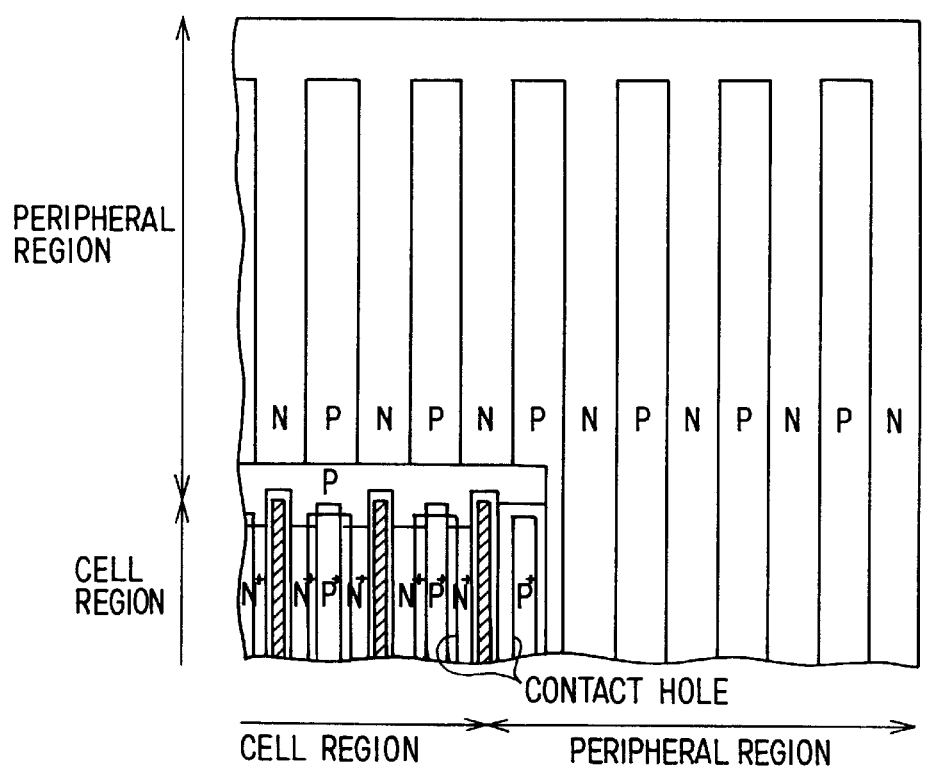
FIG. 16B is a cross sectional view of a further embodiment taken along the plane indicated by line 16—16 in FIG. 15.
Figure 17A:
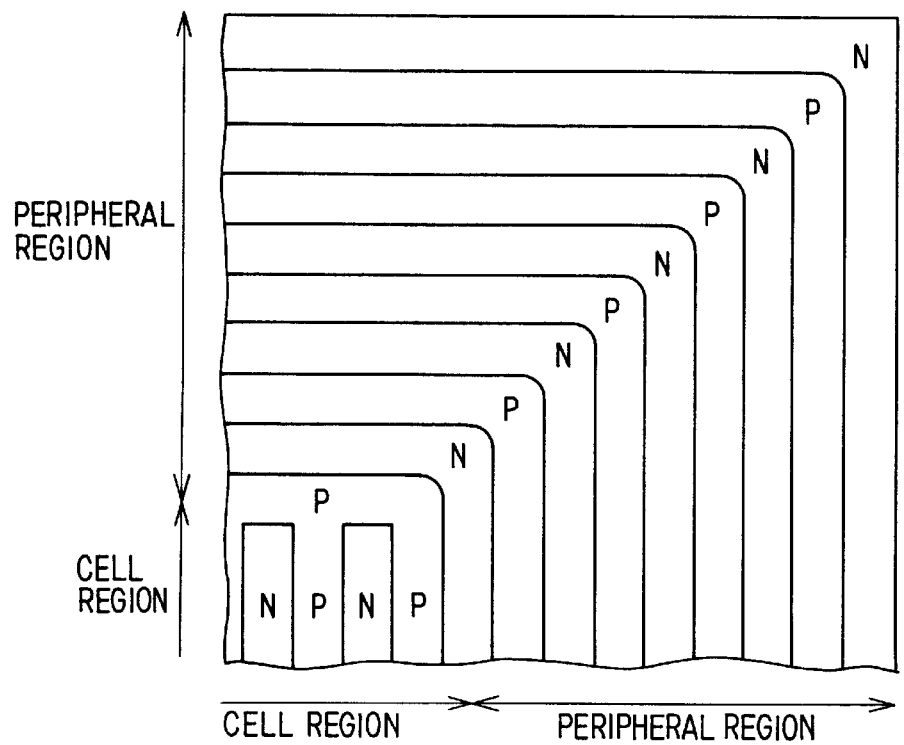
FIG. 17A is a cross sectional view taken along the plane indicated by line 17—17 in FIG. 15.
Figure 17B:
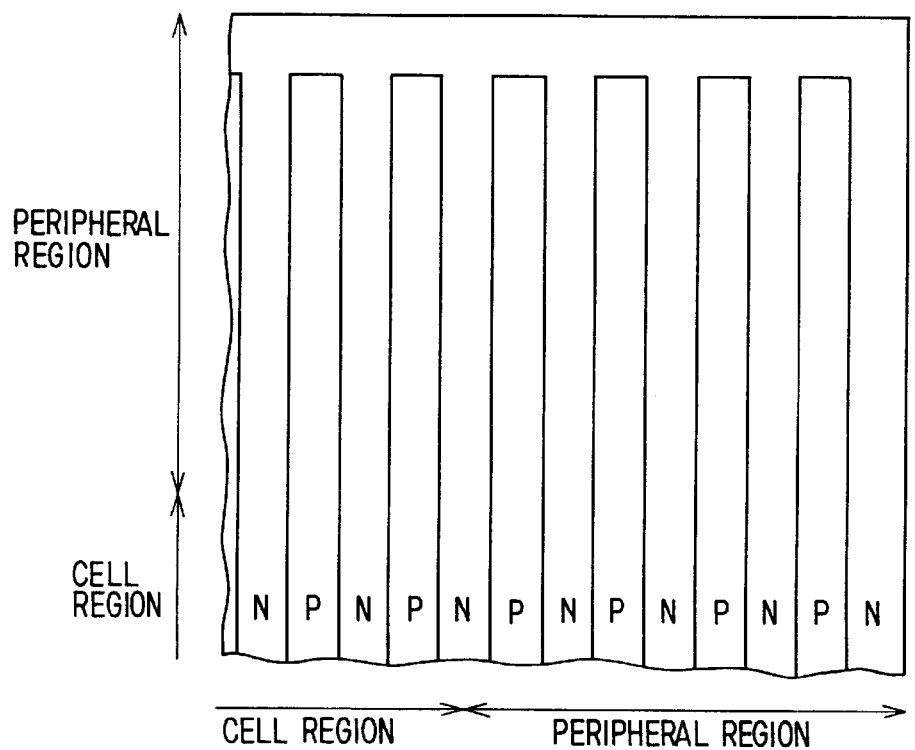
FIG. 17B is a cross sectional view of the further embodiment taken along the plane indicated by line 17—17 in FIG. 15.

FIG. 15 shows a cross sectional view of a semiconductor device that basically corresponds to the device shown in FIG. 1. As shown in FIGS. 16A and 17A, the respective P-type single crystal silicon regions 15, 15(15a) and the respective N-type single crystal silicon regions 17 may have a ring-shape in the peripheral region 13b of the super junction structure 13. That is, the silicon region 17 or 15 surrounds the silicon region 15 or 17 disposed at an inside thereof as shown in FIGS. 16A and 17B. Alternatively, as shown in FIGS. 16B and 17B, the respective P-type single crystal silicon regions 15, 15(15a) and the respective N-type single crystal silicon regions 17 may have a stripe-shape.

Figure 18:
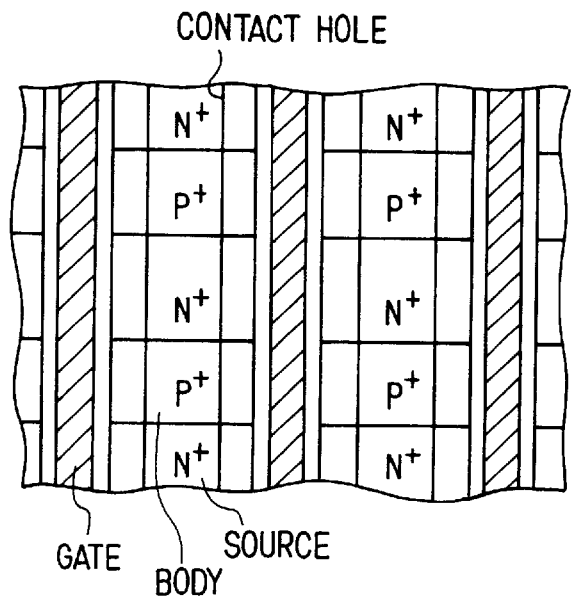
FIG. 18 is a part of a plan view of a semiconductor device of another embodiment especially showing a cell region.

Next, patterns of the source region and the P+-type body region will be explained with reference to FIG. 18. As shown in FIG. 16A or 16B, the source region and the body region are formed in a stripe-shape in the cell region. Moreover, contact holes are formed so as to have a stripe-shape along the patterns of the source region and the body region, each of which exposes the body region and the source regions which are disposed at both sides of the body region. On the other hand, in FIG. 18, the source region and the body region are alternately formed along the gate electrode. In this case, even if an interval between the adjoining gate electrodes become narrower, the contact holes can be made relatively easily to expose the source region and the body region. Therefore, the interval can be narrower, so that a degree of integration of cells is increased.

Next, an effective structure in the device when the degree of integration of cells is increased will be explained.

Figure 19:
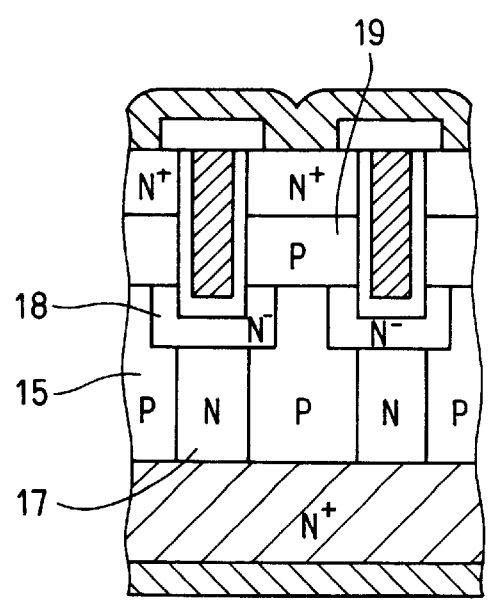
FIG. 19 is a part of a cross sectional view of another embodiment especially showing a cell region.

Referring FIG. 19, after the super junction structure which has the P-type single crystal silicon regions 15, 15(15a) and the N-type single crystal silicon regions 17 is formed, N−-type single crystal silicon regions 18 are formed at a surface portion of the super junction structure by, for example, ion implantation so that a width of each of the N-type single crystal silicon regions 17 becomes wider at the surface portion s shown in FIG. 19. By employing the N−-type single crystal silicon regions 18, the trenches are easily aligned to the N-type single crystal silicon regions 17 to form MOS structure surely in a vertical direction. That is, a bottom of the trench should be located within the N-type single crystal silicon region 17 to form the MOS structure. When the interval between the cells becomes narrow, an alignment accuracy in aligning the trench with the N-type single crystal silicon region 17 becomes severe. Therefore, the N−-type single crystal silicon region 18 makes it easier to align the trench with the N-type single crystal silicon region 17.

While the present invention has been shown and described with reference to the foregoing preferred embodiment, it will be apparent to those skilled in the art that changes in form and detail may be therein without departing from the scope of the invention as defined in the appended claims.

What is claimed is:

1. A semiconductor device having a vertical type semiconductor element comprising:
   a semiconductor substrate of a first conductive type;
   a super junction structure formed on said semiconductor substrate, and having a structure in which a first semiconductor region of the first conductive type and a second semiconductor region of a second conductive type are arrayed alternately to constitute an element forming region for said vertical type semiconductor element and to constitute a peripheral region which is disposed at a periphery of said element forming region to laterally surround said element forming region, said peripheral region including an outer end portion of said super junction structure; and
   an electrode portion formed over said element forming region of said super junction structure and electrically connected to said vertical type semiconductor element, wherein:
      said semiconductor substrate is electrically connected to said first semiconductor region, and
      said electrode portion has a pattern an edge of which is located away from said outer end portion of said super junction structure, said electrode portion being electrically connected to said second semiconductor region disposed in said peripheral region.

2. A semiconductor device having a vertical type semiconductor element according to claim 1, further comprising:
   a third semiconductor region of the second conductive type disposed in said peripheral region to electrically connect adjoining second semiconductor regions in said peripheral region and to be electrically connected to said electrode portion.

3. A semiconductor device having a vertical type semiconductor element according to claim 1, further comprising:
   a fourth semiconductor region of the first conductive type disposed in said peripheral region to electrically connect each first semiconductor region located in said peripheral region.

4. A semiconductor device having a vertical type semiconductor element according to claim 1, wherein:
   said element forming region comprises trench gate type MOSFETs to constitute said vertical type semiconductor element, each MOSFET includes:
      a body region of the second conductive type located over said super junction structure in said element forming region, said body region being electrically connected to said second semiconductor region in said element forming region;
      a source region of the first conductive type located in said body region; and
      a gate electrode buried in a trench penetrating said body region to said first semiconductor region in said element forming region to define a channel between said source region and said first semiconductor region in said element forming region, said electrode portion being electrically connected to said body region and said source region.

5. A semiconductor device having a vertical type semiconductor element according to claim 2, wherein:
   said element fanning region comprises trench gate type MOSFETs to constitute said vertical type semiconductor element, each MOSFET includes:
      a body region of the second conductive type located over said super junction structure in said element forming region, said body region being electrically connected to said second semiconductor region in said element forming region;
      a source region of the first conductive type located in said body region; and
      a gate electrode buried in a trench penetrating said body region to said first semiconductor region in said element forming region to define a channel between said source region and said first semiconductor region in said element forming region, said electrode portion being electrically connected to said body region and said source region.

6. A semiconductor device having a vertical type semiconductor element according to claim 5, wherein:
   said third semiconductor region has a same thickness as said body region.

7. A semiconductor device having a vertical type semiconductor element according to claim 2, further comprising:
   a thermal oxide film located over said third semiconductor region.

8. A semiconductor device having a vertical type semiconductor element according to claim 5, further comprising:
   a thermal oxide film located over said third semiconductor region.

9. A semiconductor device having a vertical type semiconductor element according to claim 4, further comprising:
   a fifth semiconductor region of the first conductive type located under said trench to encompass a bottom portion of said trench and to contact said first semiconductor region in said element forming region.

10. A semiconductor device having a vertical type semiconductor element according to claim 1, wherein:
    said super junction structure has a stripe pattern in which said first and second semiconductor regions are alternately aligned.

11. A semiconductor device having a vertical type semiconductor element according to claim 10, wherein:
    said outer end portion of said super junction structure is terminated by the outermost first semiconductor region of the first conductive type, the outermost first semiconductor region being an annular pattern to which each first semiconductor region is connected.

12. A semiconductor device having a vertical type semiconductor element according to claim 11, further comprising:
    an outer electrode contacting a surface of said outermost first semiconductor region.

13. A semiconductor device having a vertical type semiconductor element according to claim 1, wherein:
    said super junction structure has a stripe pattern constituting said element forming region and an annular pattern constituting said peripheral region.

14. A semiconductor device having a vertical type semiconductor element according to claim 13, wherein;
    said outer end portion of said super junction structure is terminated by the outermost first semiconductor region of the first conductive type.

15. A semiconductor device having a vertical type semiconductor element according to claim 13, wherein:
    each second semiconductor region in said element forming region is connected mutually.

16. A semiconductor device having a vertical type semiconductor element according to claim 14, further comprising:
    an outer electrode contacting a surface of said outermost first semiconductor region.

17. A semiconductor device having a vertical type semiconductor element comprising:
    a semiconductor substrate;
    a cell region disposed on said semiconductor substrate, said cell region having a first super junction structure in which a first semiconductor region of a first conductive type and a second semiconductor region of a second conductive type are alternately aligned;
    a peripheral region disposed on said semiconductor substrate to surround said cell region, said peripheral region having a second super junction structure in which a third semiconductor region of the first conductive type and a fourth semiconductor region of the second conductive type and a third semiconductor region of the first conductive type and a fourth semiconductor region of the second conductive type are alternately aligned;
    a first electrode disposed over said cell region to electrically connect to said second semiconductor region, said first electrode having a pattern to be electrically connected to said fourth semiconductor region and to render an edge thereof far from an outer end portion of said peripheral region; and
    a second electrode electrically connected to said first semiconductor region.

18. A semiconductor device having a vertical type semiconductor element according to claim 17, wherein:
    said semiconductor substrate is the first conductive type; and
    said second electrode is disposed on a rear surface of said semiconductor substrate, said first and third semiconductor regions being electrically connected to said second electrode through said semiconductor substrate.

19. A semiconductor device having a vertical type semiconductor element according to claim 17, wherein said cell region further comprises trench gate type MOSFET cells, each MOSFET cell includes:
    a body region of the second conductive type intervening between said first electrode and said first super junction structure, said first electrode being electrically connected to said second semiconductor region through said body region;
    a source region of the first conductive type located in said body region and electrically connected to said first electrode; and
    a gate electrode buried in a trench penetrating said body region to said first super junction structure to define a channel between said source region and said first semiconductor region.

20. A semiconductor device having a vertical type semiconductor element according to claim 17, wherein said peripheral region further comprises a bridging region of the second conductive type disposed on said second super junction structure to electrically connect adjoining forth semiconductor regions, said first electrode being electrically connected to said fourth semiconductor region though said bridging region.

21. A semiconductor device having a vertical type semiconductor element according to claim 19, wherein said peripheral region further comprises a bridging region of the second conductive type disposed on said second super junction structure to electrically connect adjoining fourth semiconductor regions, said first electrode being electrically connected to said forth semiconductor region through said bridging region.

22. A semiconductor device having a vertical type semiconductor element according to claim 20, further comprising a thermal oxide film located over said bridging region.

23. A semiconductor device having a vertical type semiconductor element according to claim 21, further comprising a thermal oxide film located over said bridging region.

24. A semiconductor device having a vertical type semiconductor element according to claim 19, further comprising:
    an enveloping region of the first conductive type located under said trench to encompass a bottom portion of said trench, said enveloping region contacting said first semiconductor region.

* * * * *